(12) United States Patent
Shima

(10) Patent No.: US 7,030,465 B2
(45) Date of Patent: Apr. 18, 2006

(54) SEMICONDUCTOR DEVICE THAT CAN INCREASE THE CARRIER MOBILITY AND METHOD FOR FABRICATING THE SAME

(75) Inventor: Masashi Shima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 42 days.

(21) Appl. No.: 10/804,054

(22) Filed: Mar. 19, 2004

(65) Prior Publication Data
US 2005/0098854 A1    May 12, 2005

(30) Foreign Application Priority Data
Nov. 12, 2003    (JP) ............................. 2003-382460

(51) Int. Cl.
*H01L 31/0256* (2006.01)
(52) U.S. Cl. ...................... 257/616; 257/613
(58) Field of Classification Search ................. 257/18, 257/19, 20, 22, 616
See application file for complete search history.

(56) References Cited

U.S. PATENT DOCUMENTS

| 4,080,719 A * | 3/1978 | Wilting |
| 6,544,854 B1 * | 4/2003 | Puchner et al. |
| 6,815,279 B1 * | 11/2004 | Yagishita et al. |

FOREIGN PATENT DOCUMENTS

JP    2002-76347    3/2002

\* cited by examiner

*Primary Examiner*—Nathan J. Flynn
*Assistant Examiner*—Kevin Quinto
(74) *Attorney, Agent, or Firm*—Westerman, Hattori, Daniels & Adrian, LLP

(57) ABSTRACT

The semiconductor device comprises a 2–6 nm-thickness channel layer 18 of SiGe formed over a silicon substrate 10; a gate electrode 22 formed over the channel layer 18 with a gate insulation film 20 formed therebetween; and a source/drain diffused layer 32 formed on both sides of the gate electrode 22. The thickness of the channel layer is set to be as thin as 2–6 nm, whereby the quantum confining effect can be caused in the channel layer. Accordingly, the effective band gap $E_g$ of the channel layer can be large. The effective band gap $E_g$ of the channel layer can be large, whereby the OFF-state current $I_{off}$ can be decreased. Furthermore, the concentration of a dopant impurity to be implanted into the channel layer does not have to be high, and accordingly the electric fields vertical to the substrate surface never become strong. The scattering increase of the carriers in the interface between the channel layer and the gate insulation film can be accordingly suppressed. The concentration of a dopant impurity to be implanted into the channel layer does not have to be high, and the junction capacitance increase never takes place. Furthermore, a compression strain is implanted in the channel layer of SiGe, whereby the carrier mobility can be increased. Thus, the carrier mobility can be increased without the OFF-state current increase the ON-state current decrease and the junction capacitance increase. Thus, the operation speed can be increased without the OFF-state current increase and the ON-state current decrease.

16 Claims, 29 Drawing Sheets

$V_g = 0V$ $V_g = V_{dd}$

SEMICONDUCTOR DEVICE THAT CAN INCREASE THE CARRIER MOBILITY AND METHOD FOR FABRICATING THE SAME

CROSS-REFERENCE TO RELATED APPLICATION

This application is based upon and claims priority of Japanese Patent Application No. 2003-382460, filed on Nov. 12, 2003, the contents being incorporated herein by reference.

BACKGROUND OF THE INVENTION

The present invention relates to a semiconductor device and a method for fabricating the semiconductor device.

Recently, the technique of increasing a carrier mobility of a channel layer by straining the channel layer to change properties of the channel layer is much noted.

For example, PMOS transistors having channel layers of SiGe (silicon-germanium) formed on silicon substrates are proposed. When the channel layers of SiGe, whose lattice constant is larger than that of Si, are formed on the silicon substrates, compression strains are introduced into the channel layers of SiGe. Such technique can increase the electron hole mobilities.

NMOS transistors having channel layers of Si formed on buffer layers of SiGe formed on silicon substrates are also proposed. When the channel layers of Si, whose lattice constant is smaller than that of SiGe, are formed on the buffer layers of SiGe, tensile strains are introduced into the channel layers of Si. Such technique can increase the electron mobilities.

Following references disclose the background art of the present invention.

[Patent Reference 1]
Specification of Japanese Patent Application Unexamined Publication No. 2002-76347

SUMMARY OF THE INVENTION

However, the proposed techniques can increase the carrier mobility but increases OFF-state current. To decrease the OFF-state current a dopant impurity may be heavily implanted in the channel layer. However, when a dopant impurity is heavily implanted in the channel layer, the electric field strength in the direction perpendicular to the substrate surface is strong in the channel layer, and carriers are drawn to the interface between the channel layer and the gate insulation film. Then, the carriers are scattered in the interface between the channel layer and the gate insulation film, resultantly increasing the carrier mobility and decreasing the ON-state current. As described above, the proposed techniques have found it difficult to increase the carrier mobility without increasing the OFF-state current and decreasing the ON-state current. Thus, it is difficult to increase the operation speed by the proposed techniques without increasing the OFF-state current and decreasing the ON-state current.

According to one aspect of the present invention, there is provided a semiconductor device comprising: a channel layer of SiGe formed over a silicon substrate, the channel layer having a thickness of 2 to 6 nm; a gate electrode formed over the channel layer with a gate insulation film formed therebetween; and a source/drain diffused layer formed on both sides of the gate electrode.

According to another aspect of the present invention, there is provided a semiconductor device comprising: a buffer layer of SiGe formed over a silicon substrate; a channel layer of silicon formed over the buffer layer, the channel layer having a thickness of 2 to 6 nm; a gate electrode formed over the channel layer with a gate insulation film formed therebetween; and a source/drain diffused layer formed on both sides of the gate electrode.

According to further another aspect of the present invention, there is provided a method for fabricating a semiconductor device comprising the steps of: forming a channel layer of SiGe formed over a silicon substrate, the channel layer having a thickness of 2 to 6 nm; forming a gate electrode over the channel layer with a gate insulation film formed therebetween; implanting a dopant impurity into the silicon substrate with the gate electrode as a mask to form first impurity diffused regions on both sides of the gate electrode; forming a sidewall insulation film on the side wall of the gate electrode; and implanting a dopant impurity into the silicon substrate with the gate electrode and the sidewall insulation film as a mask to form second impurity diffused regions.

According to further another aspect of the present invention, there is provided a method for fabricating a semiconductor device comprising the steps of: forming a buffer layer of SiGe over a silicon substrate; forming a channel layer over the buffer layer, the channel layer having a thickness of 2 to 6 nm; forming a gate electrode over the channel layer with a gate insulation film formed therebetween: implanting a dopant impurity into the channel layer and the buffer layer with the gate electrode as a mask to form first impurity diffused regions on both sides of the gate electrode; forming a sidewall insulation film on the side wall of the gate electrode; and implanting a dopant impurity into the channel layer and the buffer layer with the gate electrode and the sidewall insulation film as a mask to from second impurity diffused regions.

As described above, according to the present invention, the thickness of the channel layer is set to be as thin as 2–6 nm, whereby the quantum confining effect can be caused in the channel layer. Accordingly, the present invention, the effective band gap $E_g$ of the channel layer can be large. According to the present invention, the effective band gap $E_g$ of the channel layer can be large, whereby the OFF-state current $I_{off}$ can be decreased. Furthermore, according to the present invention, the concentration of a dopant impurity to be implanted into the channel layer does not have to be high, and accordingly the electric fields vertical to the substrate surface never become strong. According to the present invention, the scattering increase of the carriers in the interface between the channel layer and the gate insulation film can be accordingly suppressed. The concentration of a dopant impurity to be implanted into the channel layer does not have to be high, and the junction capacitance increase never takes place. Furthermore, a compression strain implanted in the channel layer of SiGe, whereby the carrier mobility can be increased. Thus, according to the present invention, the carrier mobility can be increased without the OFF-state current increase the ON-state current decrease and the junction capacitance increase. Thus, the present invention can have the operation speed increased without the OFF-state current increase, the ON-state current decrease, etc.

According to the present invention, that of the channel layer, which is not covered by the gate electrode and the sidewall insulation film is etched off, which permits the Si atoms in the silicon substrate and the metal atoms in the metal film to react with each other when the source/drain electrodes of a metal silicide are formed. Thus, according to the present invention, even when SiGe is used as the material of the channel layer, and cobalt is used as the material of the metal film are used, the metal silicide can be low resistive. Thus, the present invention allows the material of the metal film used in forming the source/drain electrodes to be selected out of a wide variety of materials.

According to the present invention, that of the channel layer, which is exposed beyond the gate electrode and the sidewall insulation film is removed by overetching in anisotropically etching the silicon oxide film to form the side wall insulation film, whereby a semiconductor device having the channel layer of SiGe formed only just below the gate electrode and the sidewall insulation film can be fabricated without adding any step.

According to the present invention, the channel layer of SiGe is formed only just below the gate electrode, whereby the source/drain diffused layer and the pocket regions are not formed in the channel layer of SiGe and is formed only in the silicon substrate. The source/drain diffused layer and the pocket regions do not have to be formed in the channel layer the impurity profile of which is difficult to control. The present invention facilitates controlling the impurity profile.

According to the present invention, that of the channel layer, which is exposed beyond the gate electrode is removed by overetching in patterning a polysilicon film to form the gate electrode, whereby a semiconductor device having the channel layer of SiGe formed only just below the gate electrode can be fabricated without adding any step.

According to the present invention, the Ge composition of the channel layer is decreased from the side nearer to the silicon substrate toward the gate insulation film. Furthermore, the channel layer is formed as thin as 2–6 nm so that the quantum confining effect can take place in the channel layer. Thus, according to the present invention, the effective band gap in the channel layer can be small. The present invention can provide a semiconductor device of high carrier mobility and resultantly high operation speed while preventing the OFF-state current increase, the ON-state current decrease, etc. without failure.

According to the present invention, the channel layer of silicon formed on the buffer layer of SiGe is formed as thin as 2–6 nm, whereby the quantum confining effect can be caused in the channel layer, and the effective band gap can be small. Furthermore, according to the present invention, crystal strains are introduced in the channel layer of silicon, whereby the carrier mobility can be increased. Thus, the present invention can provide a semiconductor device which, even when the channel layer of silicon is formed on the buffer layer of SiGe, can increase the carrier mobility without the OFF-state current increase, the ON-state current decrease, etc. and resultantly can increase the operation speed.

DETAILED DESCRIPTION OF THE INVENTION

A First Embodiment

Figure 1:
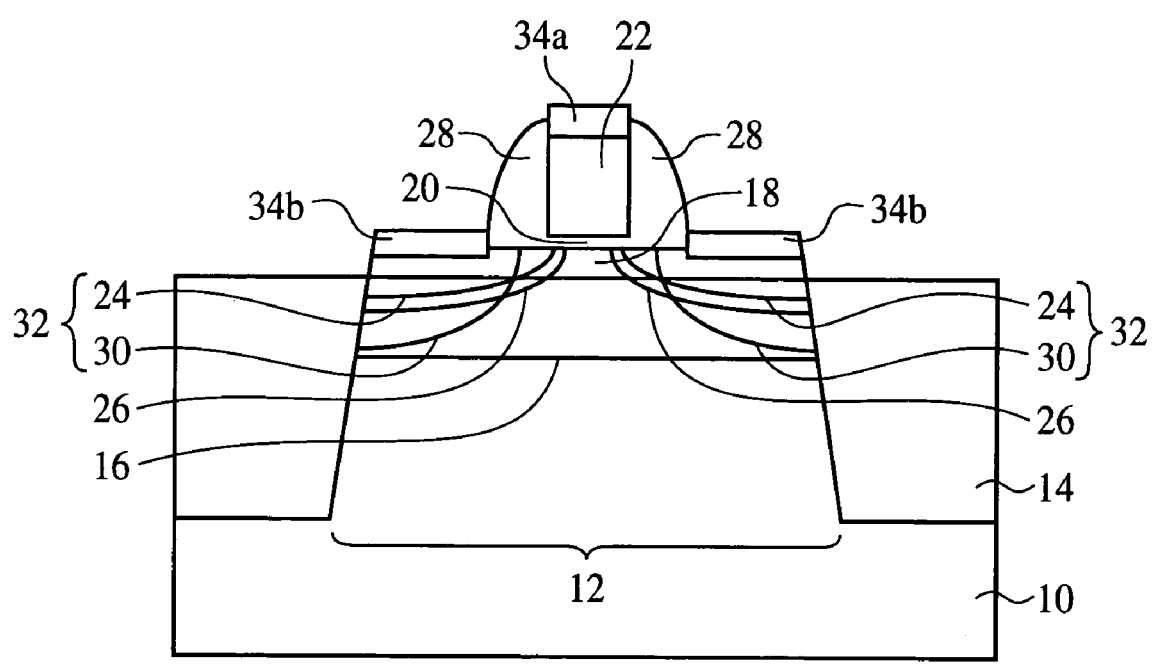
FIG. 1 is a sectional view of the semiconductor device according to a first embodiment of the present invention.

The semiconductor device according to a first embodiment of the present invention and a method for fabricating the semiconductor device will be explained with reference to FIGS. 1 to 12. FIG. 1 is a sectional view of the semiconductor device according to the present embodiment.

(The Semiconductor Device)

First, the semiconductor device according to the present embodiment will be explained with reference to FIG. 1.

As shown in FIG. 1, a device isolation region 14 for defining a device region 12 is formed on a silicon substrate 10.

In the device region 12 defined by the device isolation region 14, an n-type channel doped layer 16 is formed.

A channel layer 18 of SiGe is formed on the device region 12 with the channel doped layer 16 formed in. The composition of the channel layer 18 is set to be, e.g., $Si_{0.8}Ge_{0.2}$. Because of the lattice constant of SiGe, which is larger than that of Si, crystal strains are introduced in the channel layer 18 of SiGe. More specifically, compression strains are introduced in the channel layer 18 of SiGe. An n-type dopant impurity, for example, is implanted in the channel layer 18.

The thickness of the channel layer 18 is set to be as small as 2–6 nm. The thickness of the channel layer 18 is set to be small in the present embodiment for the following reason.

Figure 2A:
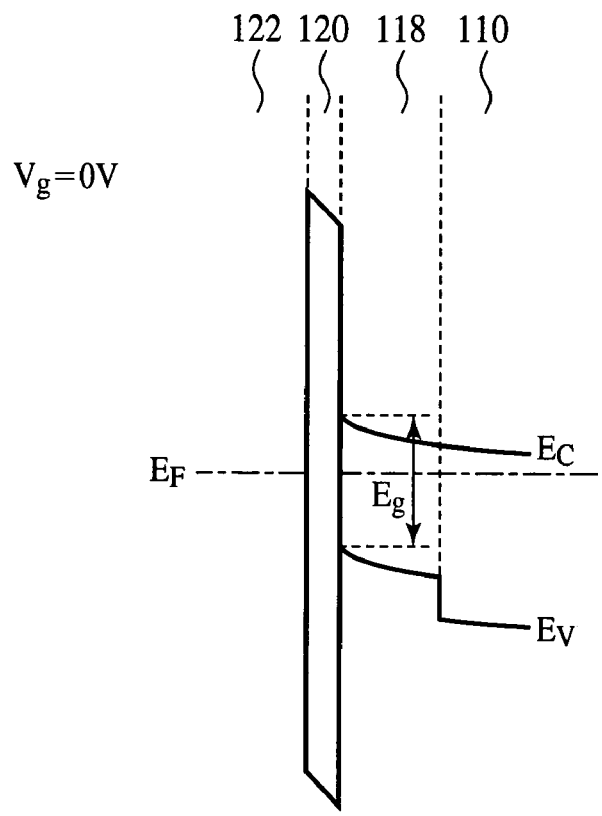
FIGS. 2A and 2B are views of energy band structures of a channel layer of SiGe formed thick on a silicon substrate.
Figure 2B:
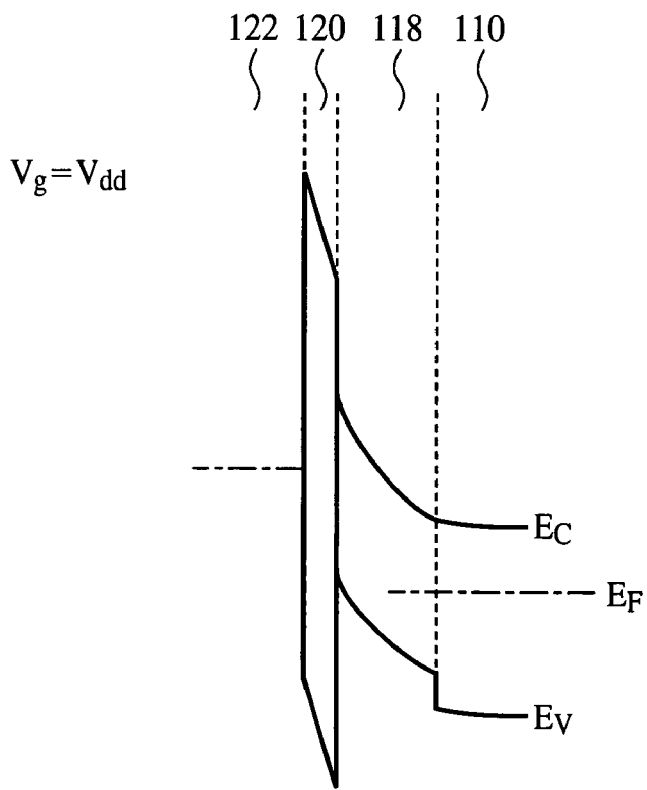

FIGS. 2A and 2B are views of an energy band structure in a case that the channel layer of SiGe is formed thick on the silicon substrate. That is, FIGS. 2A and 2B show energy band structures of a PMOS transistor having a channel layer 118, a gate insulation film 120 and a gate electrode 122 sequentially formed. The thickness of the channel layer 118 is, e.g., about 10–20 nm. FIG. 2A is the energy band structure with the gate voltage $V_g=0$ V, i.e., in the case that the transistor is OFF. FIG. 2B is the energy band structure with the gate voltage $V_g=V_{dd}$, i.e., in the case that the transistor is ON. $E_V$ indicates an energy of the end of the valence band. $E_C$ indicates an energy of the end of the conduction band. $E_F$ indicates a Fermi level. $E_g$ indicates a band gap.

As seen in FIGS. 2A and 2B, the band gap $E_g$ of the channel layer 118 of SiGe is smaller than that of the silicon substrate 110. Accordingly, the band gap of the channel layer 118 of SiGe which is formed simply thick on the silicon substrate 110 is smaller than that of a channel layer formed of Si in a silicon substrate. Thus, when the channel layer 118 of SiGe is formed simply thick on the silicon substrate 110, the OFF-state current $I_{off}$, i.e., the leak current at the time when the transistor is OFF is large.

To prevent the OFF-state current $I_{off}$ increase, a dopant impurity will be implanted in the channel layer 118.

Figure 3A:
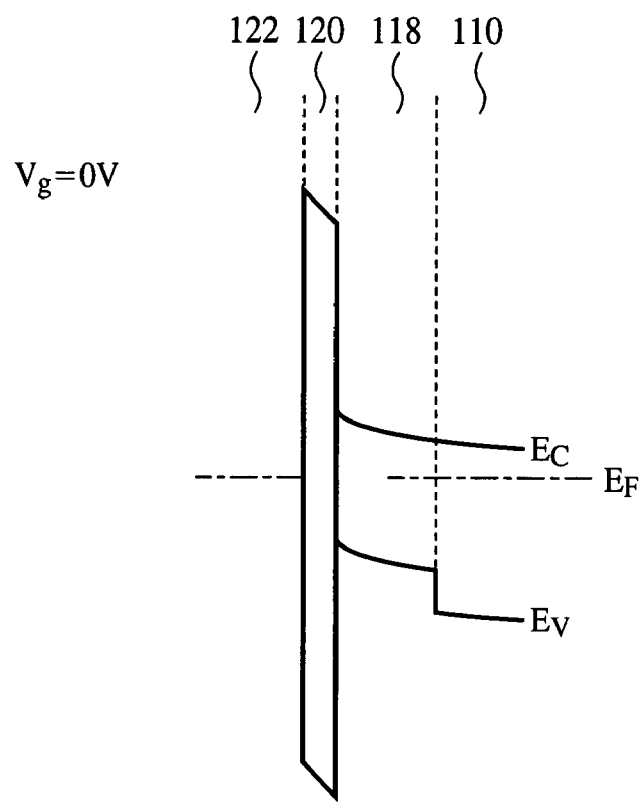
FIGS. 3A and 3B are views of energy band structures of a channel layer of SiGe heavily doped with an n-type dopant impurity.
Figure 3B:
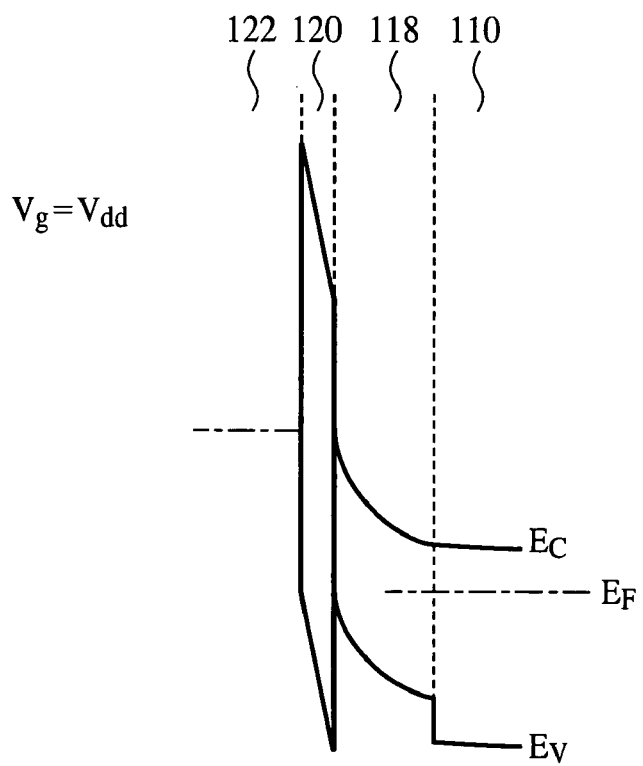

FIGS. 3A and 3B are views of an energy band structure in the case that an n-type dopant impurity is relatively heavily implanted in the channel layer of SiGe. In the PMOS transistor of FIGS. 3A and 3B, the n-type dopant impurity is implanted in the channel layer 118 by, e.g., 1.7 times the n-type dopant impurity implanted in the PMOS transistor of FIGS. 2A and 2B. FIG. 3A is the energy band structure with the gate voltage $V_g=0$ V, i.e., in the case that the transistor is OFF. FIG. 3B is the energy band structure with the gate voltage $V_g=V_{dd}$, i.e., in the case that the transistor is ON.

The relatively heavy implantation of an n-type dopant impurity in the channel layer 118 of SiGe can make the OFF-state current $I_{off}$ small.

However, when an n-type dopant is relatively heavily implanted in the channel layer 118 of SiGe, electric fields are applied strongly to the channel layer 118 in the direction perpendicular to the substrate surface, and the carriers are drawn to the interface between the channel layer 118 and the gate insulation film 120. The carriers are scattered in the interface between the channel layer 118 and the gate insulation film 120, decreasing the carrier mobility and the ON-state current $I_{on}$. When an n-type dopant impurity is relatively heavily in the channel layer 118, the junction capacitance is increased, and the operation speed of the transistor is accordingly decreased.

Figure 4A:
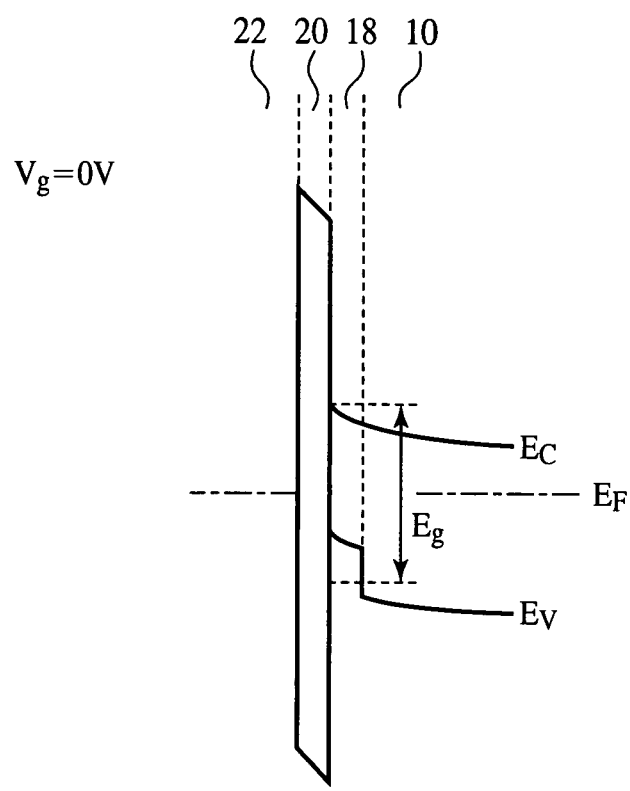
FIGS. 4A and 4B are views of energy band structures of the semiconductor device according to a first embodiment of the present invention.
Figure 4B:
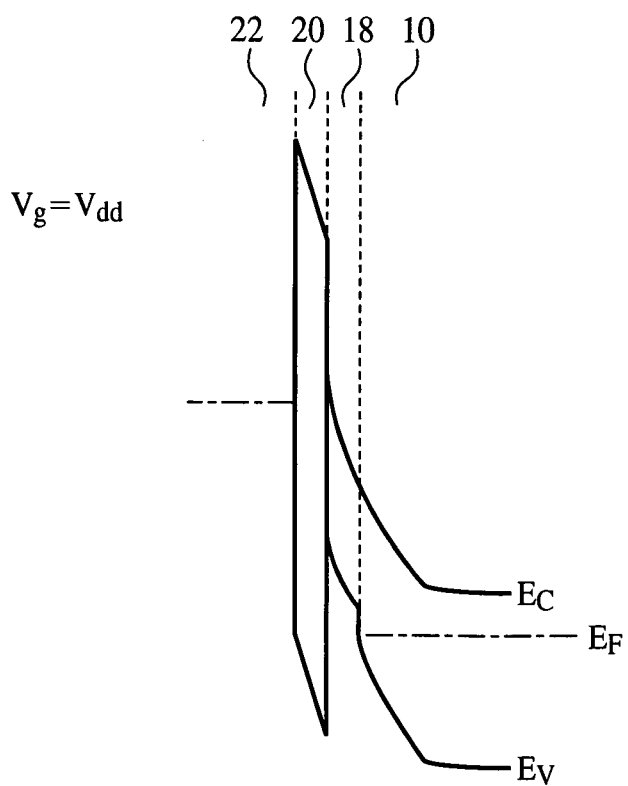

FIGS. 4A and 4B are views of an energy band structure of the semiconductor device according to the present embodiment, i.e., views of an energy band structure in the case that the thickness of the channel layer of SiGe is set to be small. That is, FIGS. 4A and 4B show energy band structures of the PMOS transistor having the 2–6 nm-thickness-channel layer 18, the gate insulation film 20 and the gate electrode 22 sequentially formed. The concentration of an n-type dopant impurity implanted in the channel layer 18 was relatively low, as in the PMOS transistor of FIGS. 2A and 2B.

Because of the channel layer 18, which is as thin as 2–6 nm, the quantum confining effect can be obtained in the channel layer 18. Thus, according to the present embodiment, the effective band gap $E_g$ in the channel layer 18 can be large. According to the present embodiment, the effective band gap $E_g$ in the channel layer 18 can be made large, whereby the OFF-state current $I_{off}$ can be decreased. Furthermore, in the present embodiment, the concentration of a dopant impurity to be implanted in the channel layer 18 does not have to be high, and the electric field perpendicular to the substrate surface never become strong. Accordingly, the present embodiment can suppress the increase of the carrier scattering in the interface between the channel layer 18 and the gate insulation film 20. The concentration of the dopant impurity to be implanted in the channel layer 18 does not have be high, and accordingly the junction capacitance is never increased. On the other hand, in the channel layer 18 of SiGe, compression strains are introduced, which can increase the carrier mobility. Thus, according to the present embodiment, the carrier mobility can be increased without increasing the OFF-state current, decreasing the ON-state current and increasing the junction capacitance.

The lower limit of the thickness of the channel layer 18 is 2 nm. This is because when the channel layer 18 is too thin, the ratio of the carriers moving in the channel doped layer 16 is increased, and the carrier mobility as a whole cannot be increased.

The upper limit of the thickness of the channel layer 18 is 6 nm. This is because the thickness of the channel layer 18 must be 6 nm or below 6 nm so as to make the quantum confining effect sufficient in the channel layer 18. The quantum confining effect takes place to some extent even when the thickness of the channel layer 18 is a little larger than 6 nm, and the thickness of the channel layer 18 may be a little thicker than 6 nm. However, in order to make the quantum confining effect sufficient in the channel layer 18 to make the bad gap sufficiently large, it is preferable to set the thickness of the channel layer 18 at 6 nm or below 6 nm.

The composition of the channel layer 18 is $Si_{0.8}Ge_{0.2}$ here. However, the composition of the channel layer 18 is not limited to $Si_{0.8}Ge_{0.2}$ and can be suitably set. The composition ratio of Ge of the channel layer 18 may be suitably set within the range of, e.g., 5–30%.

The gate insulation film 20 of, e.g., silicon oxide film is formed on the channel layer 18. The film thickness of the gate insulation film 20 is, e.g., about 1.5 nm.

The gate electrode 22 of, e.g., polysilicon is formed on the gate insulation film 20.

P-type impurity diffused regions 24 forming shallow regions of the extension source/drain structure are formed in the channel layer 18 and the silicon substrate 10 on both sides of the gate electrode 22. Such impurity diffused regions 24 are called extension regions.

N-type pocket regions 26 are formed adjacent to the p-type impurity diffused regions 24 in the channel layer 18 and the silicon substrate 10. The pocket regions 26 are for preventing the short channel effect.

A sidewall insulation film 28 of, e.g., silicon oxide film is formed on the side wall of the gate electrode 22.

P-type impurity diffused regions 30 forming deep regions of the extension source/drain structure are formed in the channel layer 18 and the silicon substrate 10 on both sides of the gate electrode 22 with the sidewall insulation film 28 formed on the side wall.

The shallow impurity diffused regions, i.e., the extension regions 24, and the deep impurity diffused regions 30 form a source/drain diffused layer 32 of the extension source/ drain structure.

A metal silicide film 34a of nickel silicide (NiSi) is formed on the gate electrode 22. The polysilicon film 22 and the metal silicide film 34a form the gate electrode of the polycide structure.

A metal silicide film 34b of nickel silicide is formed on the source/drain diffused layer 32. The metal silicide film formed on the source/drain diffused layer 32 functions as source/drain electrodes 34b.

Thus, the semiconductor device according to the present embodiment is constituted.

The semiconductor device according to the present embodiment is characterized mainly in that the thickness of the channel layer 18 of SiGe formed on the silicon substrate 10 is as thin as 2–6 nm.

As described above, in the case that the channel layer 118 of SiGe is formed simply thick on the silicon substrate 110, the carrier mobility can be increased, but the OFF-state current $I_{off}$ is increased. The OFF-state current $I_{off}$ can be decreased by setting high the concentration of the dopant impurity to be implanted in the channel layer 118, but in this case, as described above, the carrier mobility decrease, the ON-state current $I_{on}$ decrease, the junction capacitance increase, etc. are caused.

In contrast to this, in the present embodiment, the thickness of the channel layer 18 is set as thin as 2–6 nm, whereby the quantum confining effect can be generated. Accordingly, in the present embodiment, the effective band gap $E_g$ of the channel layer 18 can be made large. In the present embodiment, the effective band gap $E_g$ of the channel layer 18 can be made large, whereby the OFF-state current $I_{off}$ can be decreased. Furthermore, in the present embodiment, the concentration of a dopant impurity to be implanted in the channel layer 18 is not required to be high, and accordingly, the electric fields perpendicular to the substrate surface never become strong. Thus, according to the present embodiment, the increase of the scattering of the carriers in the interface between the channel layer 18 and the gate insulation film 20 can be suppressed. Furthermore, the concentration of a dopant impurity to be implanted in the channel layer 18 is not required to be high, and the increase of the junction capacitance never takes place. Furthermore, because of compression strains introduced in the channel layer 18 of SiGe, the carrier mobility can be increased. Thus, according to the present embodiment, the carrier mobility can be increased without the increase of the OFF-state current, the decrease of the ON-state current and the increase of the junction capacitance. According to the present embodiment, the operation speed can be increased without the increase of the OFF-state current, the decrease of the ON-state current, etc.

(Evaluation Result)

Next, the result of evaluating the semiconductor device according to the present embodiment will be explained.

Figure 5:
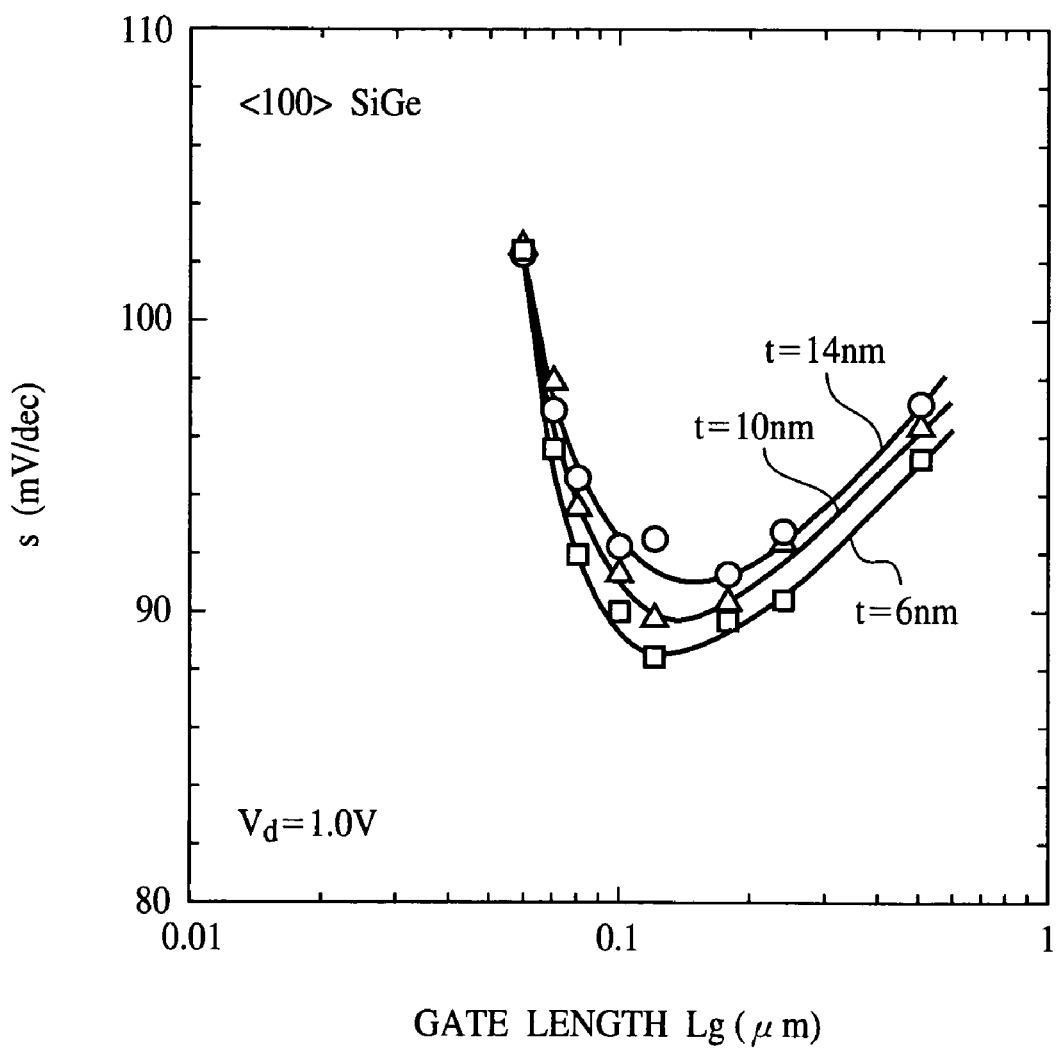
FIG. 5 is a graph of relationships between the gate length and the s value.

FIG. 5 is a graph of relationships between gate lengths and s values. The gate lengths $L_g$ are taken on the horizontal axis. The s (sub threshold slope) values of transistors are taken on the vertical axis. The "□" marks indicate the present embodiment, i.e., the case that the thickness of the channel layer is 6 nm. The "Δ" marks indicate the case that the thickness of the channel layer is 10 nm. The "○" marks indicate the case that the thickness of the channel layer is 14 nm. The plane direction of the channel layer 18 of SiGe was <100>. The drain voltage $V_d$ was 1.0 V.

As seen in FIG. 5, there is a tendency that the s value is smaller as the thickness of the channel layer 18 is smaller. When the thickness of the channel layer 18 is 6 nm, the s value is minimum. That is, when the thickness of the channel layer 18 is 6 nm, the sub threshold characteristics are very good. Based on this, the semiconductor device according to the present embodiment can have very good subthreshold characteristics.

Figure 6:
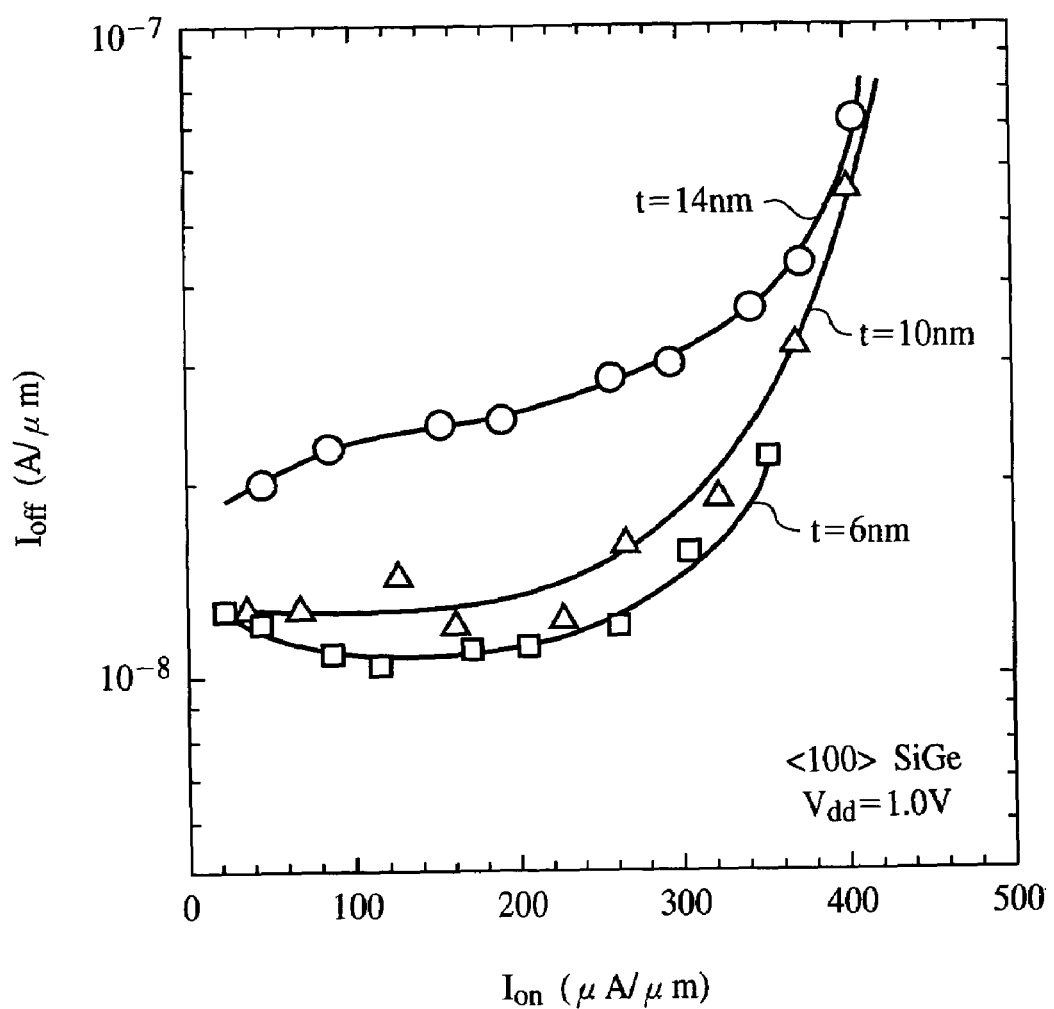
FIG. 6 is a graph of the $I_{on}$–$I_{off}$ characteristics.

FIG. 6 is a graph of $I_{on}$-$I_{off}$ characteristics. ON-state current $I_{on}$, i.e., drain current at the time when transistors are turned on is taken on the horizontal axis. OFF-state current $I_{off}$, i.e., leak current at the time when the transistors are turned off are taken on the vertical axis. The "□" marks indicate the present embodiment, i.e., the case that the thickness of the channel layer is 6 nm. The "Δ" marks indicate the case that the thickness of the channel layer is 10 nm. The "○" marks indicate the case that the thickness of the channel layer is 14 nm. The plane direction of the channel layer 18 of SiGe was <100>. The drain voltage $V_{dd}$ was 1.0 V.

As seen in FIG. 6, there is a tendency that as the thickness of the channel layer 18 of SiGe is smaller, the current intensity of the OFF-state current $I_{off}$ decreases with respect to the intensity of the OFF-state current $I_{on}$. When the thickness of the channel layer 18 of SiGe is 6 nm, the $I_{on}$ $I_{off}$ characteristics are very good. Based on this, it is found that the semiconductor device according to the present embodiment can have low OFF-current $I_{off}$ and high ON-state current $I_{on}$.

Figure 7:
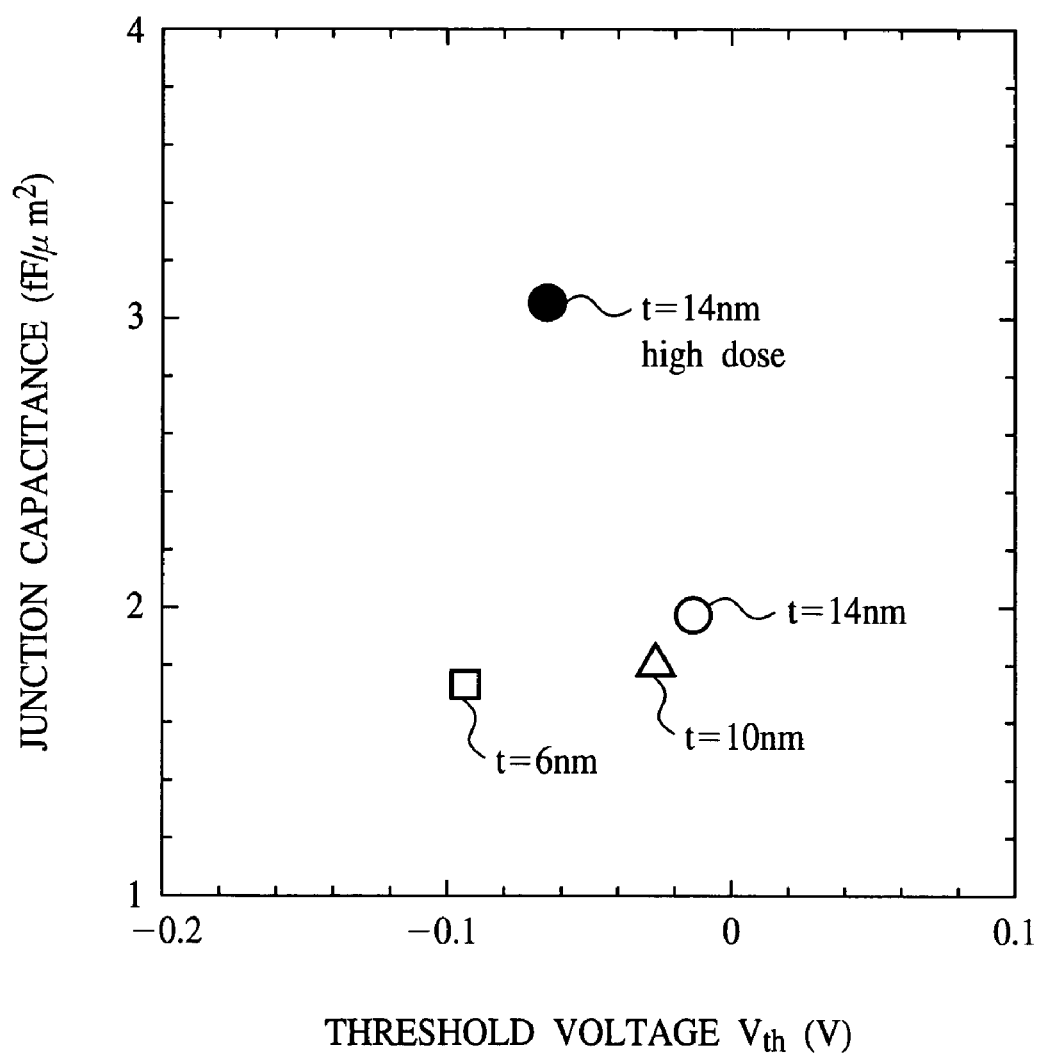
FIG. 7 is a graph of relationships between the threshold voltage and the junction capacitance.

FIG. 7 is a graph of relationships between threshold voltages and junction capacitances. The threshold voltages $V_{th}$ are taken on the horizontal axis. The junction capacitances are taken on the vertical axis. The "□" marks indicate the present embodiment, i.e., the case that the thickness of the channel layer is 6 nm. The "Δ" marks indicate the case that the thickness of the channel layer is 10 nm. The "○" marks indicate the case that the thickness of the channel layer is 14 nm. The "●" marks indicate the case that the thickness of the channel layer is 14 nm, and an n-type dopant impurity was heavily implanted in the channel layer; specifically, in the "●" marked case, the dose of then-type dopant impurity implanted in the channel layer was 1.7 times that of the n-type dopant impurity in the "□" marked case, the "Δ" marked case and the "○" marked case.

Generally, in order to decrease the OFF-state current of PMOS transistors, it is significant to set the threshold voltage $V_{th}$ low.

When the threshold voltage $V_{th}$ is decreased by implanting an n-type dopant impurity in the channel layer without making the thickness of the channel layer small, the junction capacitance is large, as seen in the comparison between the "○" marked case and the "●" marked case.

In contrast to this, the threshold voltage $V_{th}$ is decreased by making the thickness of the channel layer small, the threshold voltage $V_{th}$ can be decreased without causing the increase of the junction capacitance, as seen in the comparison among the "○" marked case, the "Δ" marked case and the "□" marked case.

Based on the above, it is found that the present embodiment can decrease the threshold voltage $V_{th}$ without causing the increase of the junction capacitance. Thus, according to the present embodiment, the OFF-state current $I_{off}$ can be decreased without causing the increase of the junction capacitance.

(The Method for Fabricating the Semiconductor Device)

Next, the method for fabricating the semiconductor device according to the present embodiment will be explained with reference to FIGS. 8A to 12. FIGS. 8A to 12 are sectional views of the semiconductor device according to the present embodiment in the steps of the method for fabricating the semiconductor device, which show the method.

Figure 8A:
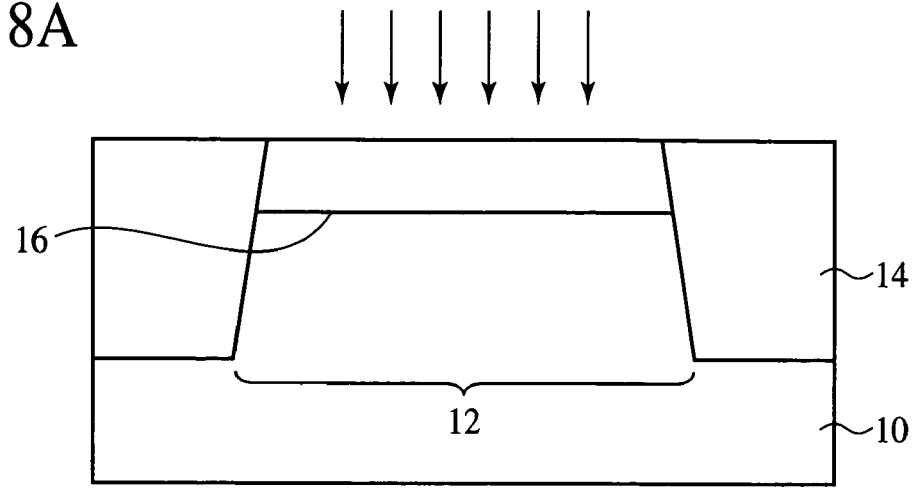
FIGS. 8A to 8C are sectional views of the semiconductor device according to the first embodiment of the present invention in the steps of the method for fabricating the semiconductor device, which show the method (Part 1).

First, as shown in FIG. 8A, device isolation regions 14 for defining a device region 12 are formed by, e.g., STI (Shallow Trench Isolation).

Next, n-type dopant impurity is implanted into the silicon substrate 10 by, e.g., ion implantation. Thus, the channel doped layer 16 is formed in the silicon substrate 10. The channel doped layer 16 is for controlling the threshold voltage $V_{th}$. The n-typedopant impurity is, e.g., arsenic (As). Asacondition for the ion implantation, the acceleration voltage is, e.g., about 200 keV.

Figure 8B:
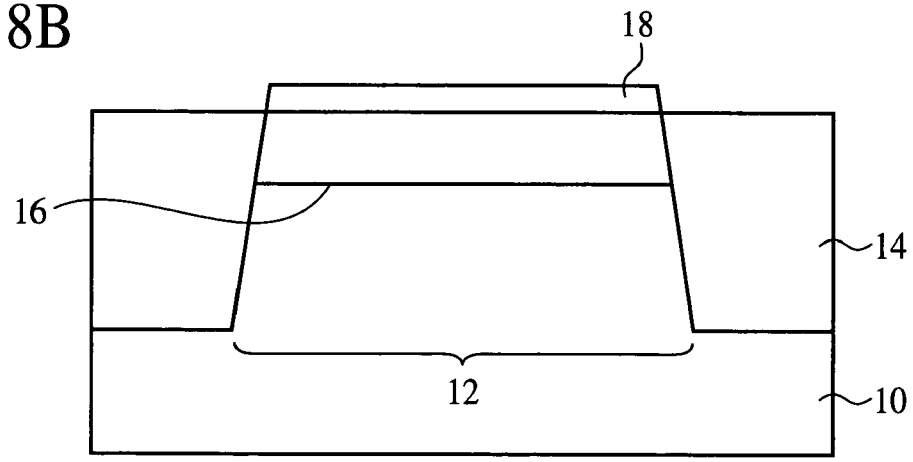

Next, as shown in FIG. 8B, the channel layer 18 of SiGe is formed in the device region 12 by, e.g., CVD. The composition of the channel layer 18 is, e.g., $Si_{0.8}Ge_{0.2}$. The thickness of the channel layer 18 is, e.g., about 2–6 nm.

Then, a cap film (not shown) of silicon is formed on the channel layer 16 by, e.g., CVD. The thickness of the cap film is, e.g., about 1.5 nm. The cap film is for forming the gate insulation film 20 by thermal oxidation without oxidizing the channel layer 18 in a later step of forming the gate insulation film 20; when the gate insulation film 20 is formed by thermal oxidation, the cap film of silicon is oxidized to form the gate insulation film 20 of the silicon oxide film.

Figure 8C:
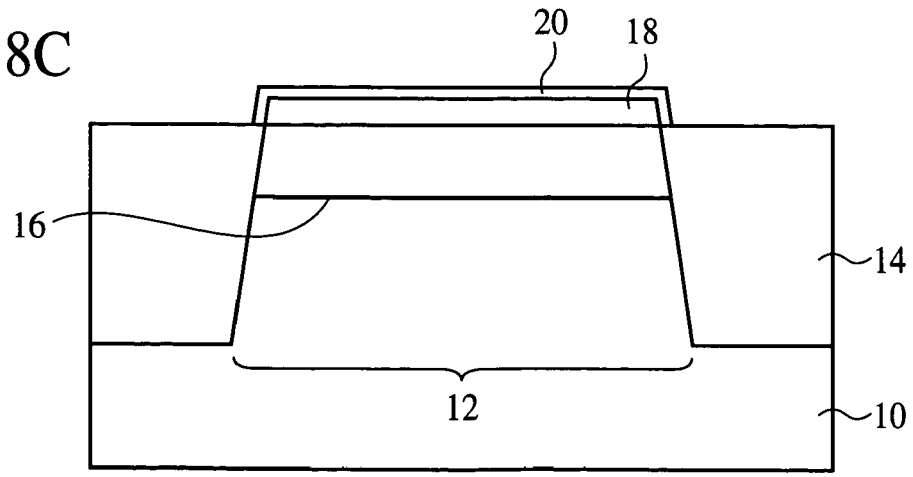

Then, as shown in FIG. 8C, the gate insulation film 20 is formed by thermal oxidation. When the gate insulation film 20 is formed, as described above, the cap film of silicon is oxidized to form the gate insulation film 20 of the silicon-oxide film.

Figure 9A:
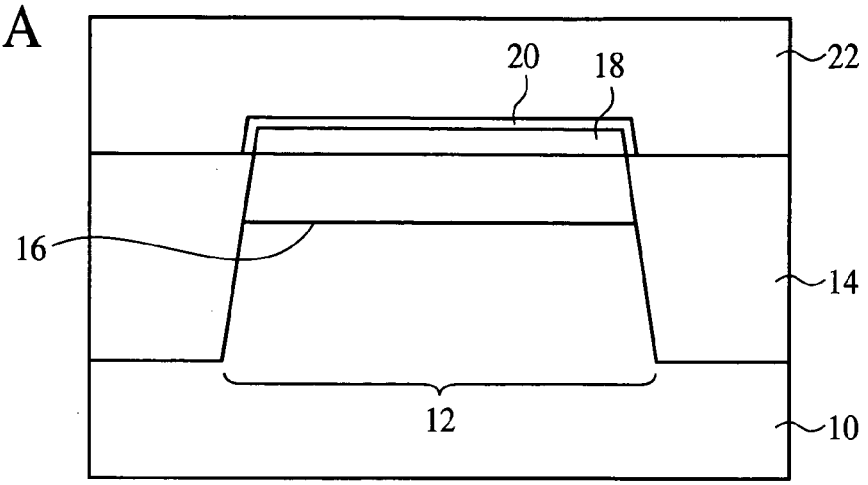
FIGS. 9A to 9C are sectional views of the semiconductor device according to the first embodiment of the present invention in the steps of the method for fabricating the semiconductor device, which show the method (Part 2).

Next, as shown n FIG. 9A, a polysilicon film 22 is formed on the entire surface by, e.g., CVD. The thickness of the polysilicon film 22 is, e.g., about 100 nm.

Then, a photoresist film 36 is formed by, e.g., spincoating. Then, the photoresist film is patterned by photolithography. Thus, a photoresist mask 36 for patterning the polysilicon film 22 is formed.

Figure 9B:
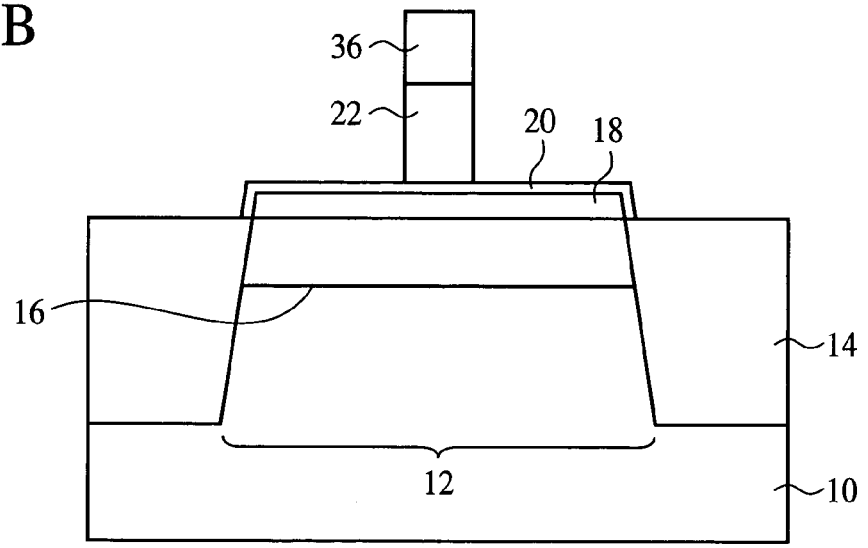

Then, as shown in FIG. 9B, with the photoresist film 36 as the mask, the polysilicon film 22 is dry etched. Thus, the gate electrode 22 is formed of the polysilicon film.

Figure 9C:
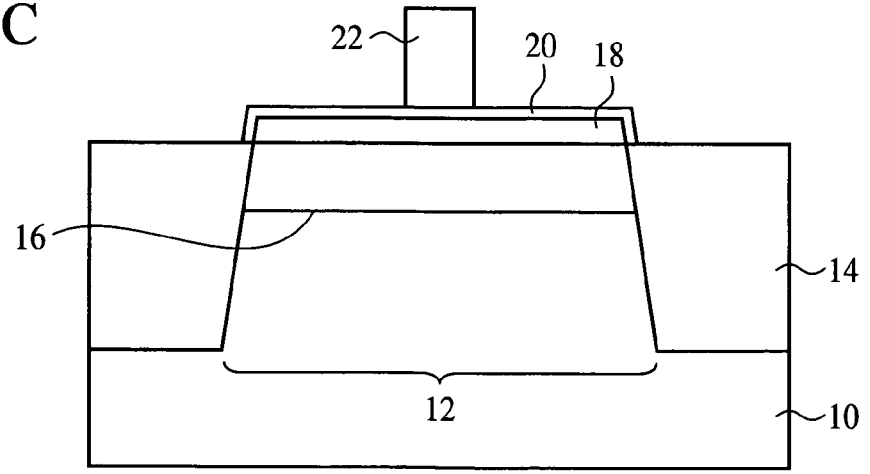

Then, as shown in FIG. 9C, the photoresist film 36 on the gate electrode 22 is released.

Figure 10A:
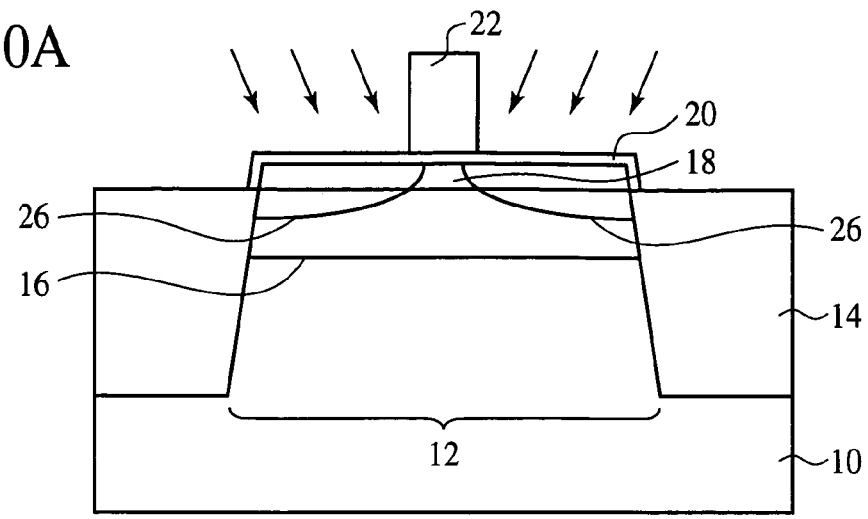
FIGS. 10A to 10C are sectional views of the semiconductor device according to the first embodiment of the present invention in the steps of the method for fabricating the semiconductor device, which show the method (Part 3).

Then, as shown in FIG. 10A, an n-type dopant impurity is implanted diagonally to the substrate surface by, e.g., ion implantation. Thus, the n type pocket regions 26 are formed. At this time, the n-type dopant impurity is implanted also in the channel layer 16. Then-type dopant impurity is, e.g. arsenic (As). As a condition for the ion implantation, the acceleration voltage is, e.g., about 20 keV.

Figure 10B:
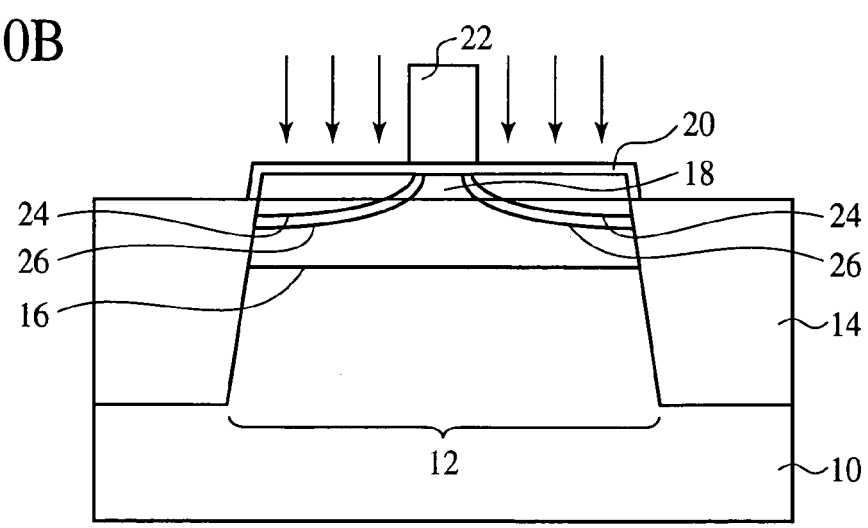

Then, as shown in FIG. 10B, with the gate electrode 22 as the mask, a p-type dopant impurity is implanted into the silicon substrate 10 by, e.g., ion implantation. At this time, the dopant impurity must not be implanted into the channel layer 18. The p-type dopant impurity is, e.g., boron. As a condition for the ion implantation, the acceleration voltage is, e.g., about 2 keV. Thus, impurity diffused regions 24 forming the extension regions are formed.

Figure 10C:
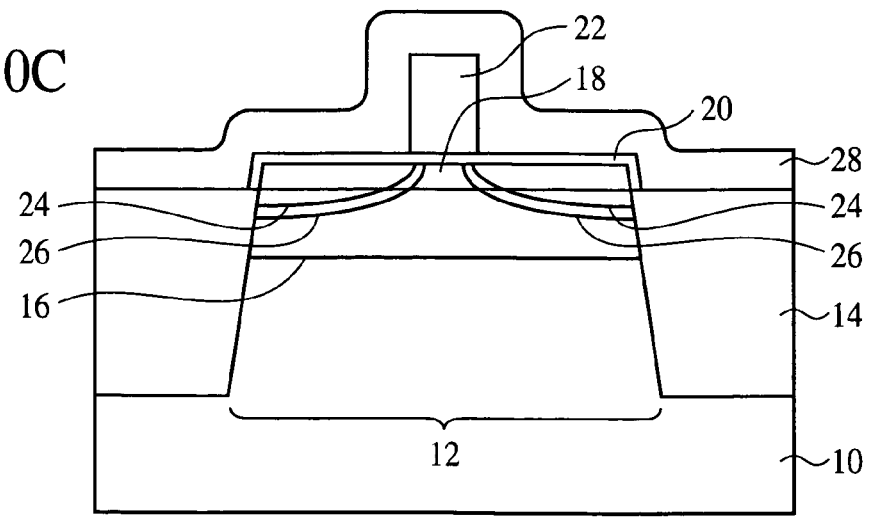

Then, as shown in FIG. 10C, a silicon oxide film 28 is formed on the entire surface by, e.g., CVD.

Figure 11A:
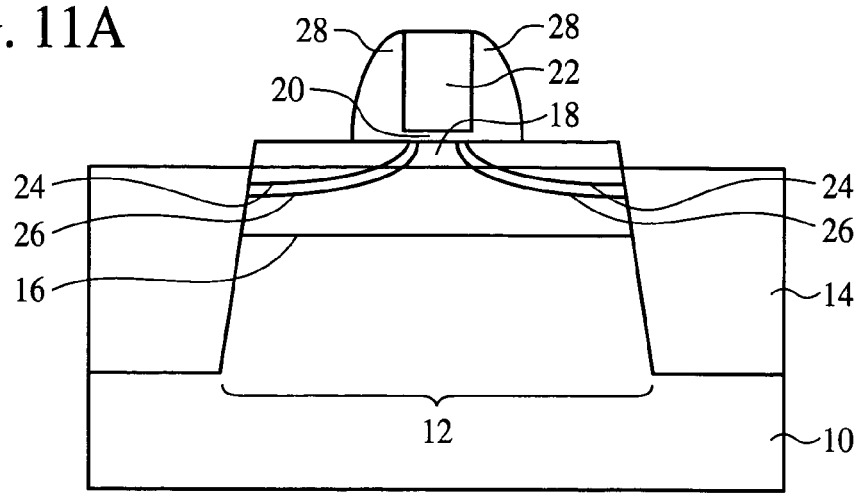
FIGS. 11A to 11C are sectional views of the semiconductor device according to the first embodiment of the present invention in the steps of the method for fabricating the semiconductor device, which show the method (Part 4).

Then, as shown in FIG. 11A, the silicon oxide film 28 is anisotropically etched. Thus, the sidewall insulation film 28 of the silicon oxide film is formed on the side wall of the gate electrode 22.

The silicon oxide film is used as the material of the sidewall insulation film 28, but the material of the sidewall insulation film 28 is not limited to the silicon oxide film. Any other insulation film can be suitably used.

Figure 11B:
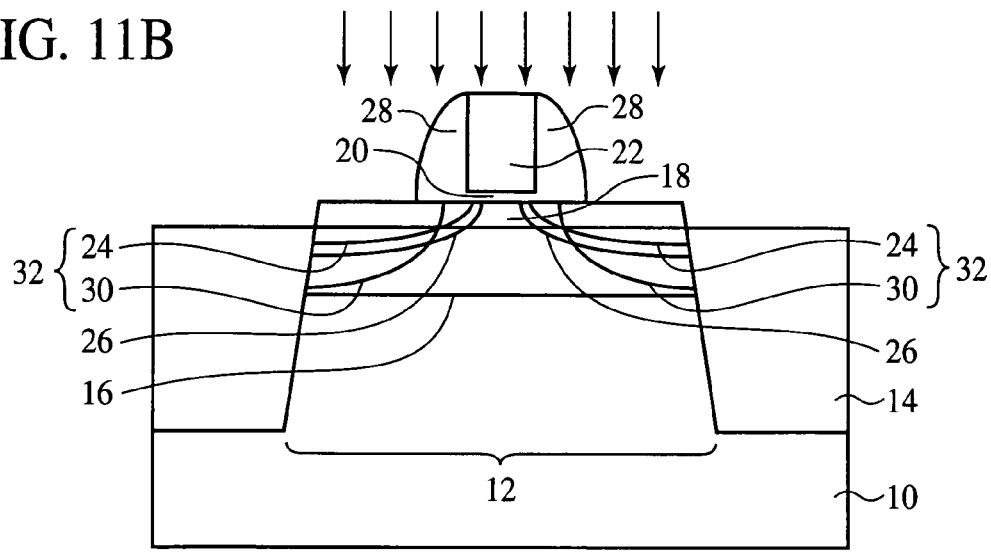

Next, as shown in FIG. 11B, with the gate electrode 22 and the sidewall insulation film 28 as the mask a p-type dopant impurity is implanted into the channel layer 18 and the silicon substrate 10. Thus, impurity diffused regions 30 forming the deep regions of the source/drain diffused layer. The p-type dopant impurity is, e.g., boron. As a condition for the ion implantation, the acceleration voltage is, e.g., 5 keV. The extension regions, i.e., the shallow impurity diffused regions 24, and the deep impurity diffused regions 30 form the source/drain diffused layer 32.

Figure 11C:
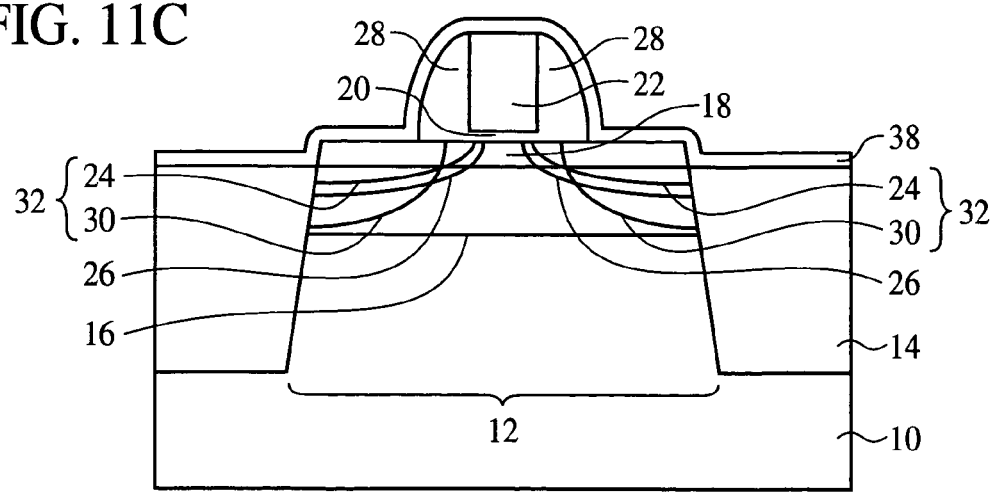

Next, as shown in FIG. 11C, a metal film 38 of, e.g., Ni is formed on the entire surface by, e.g., sputtering. The thickness of the metal film 38 is, e.g., about 10 nm.

Next, the Ni in the metal film 38 and the Si in the channel layer 18 are reacted with each other by thermal processing. The Ni in the metal film 38 and the Si in the gate electrode 22 are also reacted with each other. The thermal processing condition is, e.g., about 500° C.

Figure 12:
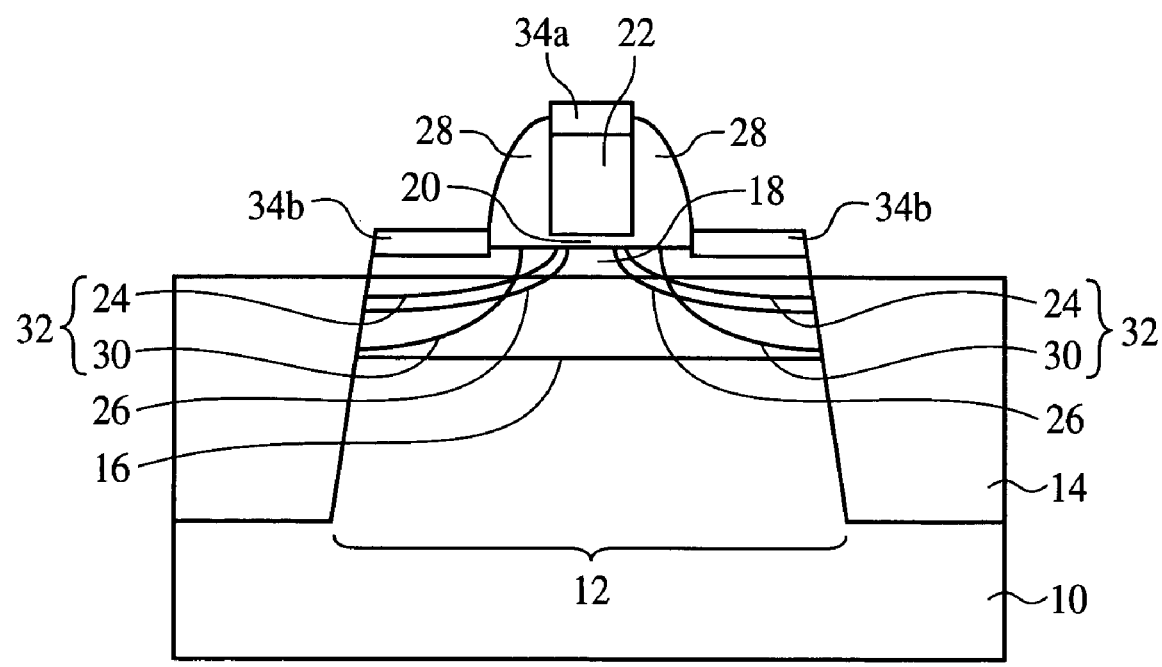
FIG. 12 is a sectional view of the semiconductor device according to the first embodiment of the present invention in the steps of the method for fabricating the semiconductor device, which show the method (Part 5).

Then, as shown in FIG. 12, the metal film 38 which has not reacted is removed. Thus, the source/drain electrodes 34b of nickel silicide (NiSi) are formed on the source/drain diffused layer 32. The metal silicide film 34a of the nickel silicide is also formed on the polysilicon film 22. The polysilicon film 22 and the nickel silicide film 34a form the gate electrode of the polycide structure.

Thus, the semiconductor device according to the present embodiment is fabricated.

A Second Embodiment

Figure 13:
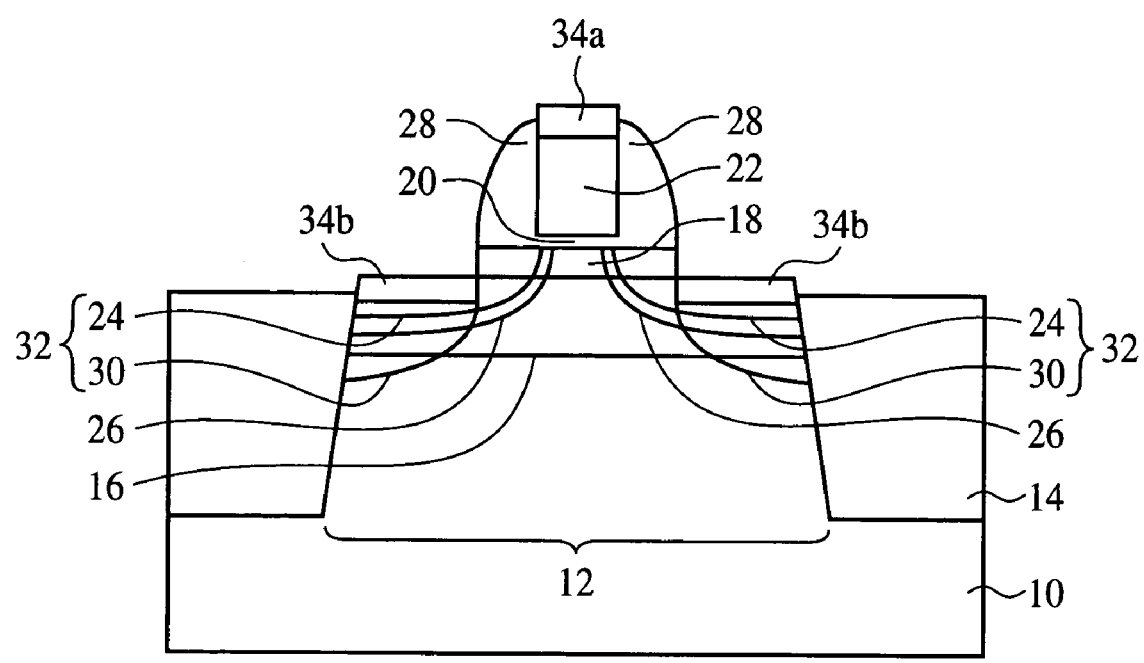
FIG. 13 is a sectional view of the semiconductor device according to a second embodiment of the present invention.

Next, the semiconductor device according to a second embodiment of the present invention will be explained with reference to FIGS. 13 to 15B. FIG. 13 is a sectional view of the semiconductor device according to the present embodiment. The same members of the present embodiment as those of the semiconductor device according to the fist embodiment and the method for fabricating the semiconductor device shown in FIGS. 1 to 12 are represented by the same reference numbers not to repeat or to simplify their explanation.

(The Semiconductor Device)

The semiconductor device according to the present embodiment is characterized mainly in that a channel layer 18 of SiGe is formed only just below a gate electrode 22 and a sidewall insulation film 28.

As shown in FIG. 13, the channel layer 18 of SiGe is formed only just below the gate electrode 22 and the sidewall insulation film 28. The channel layer 18 in the region other than the region which is just below the gate electrode 22 and the sidewall insulation film is etched off.

Source/drain electrodes 34b of cobalt silicide ($CoSi_2$) are formed on the source/drain diffused layer 32.

The source/drain electrodes 34b are formed of cobalt silicide here, but the material forming the source/drain electrodes 34b is not limited to cobalt silicide. The source/drain electrodes 34b may be formed of any other metal silicide.

Thus, the semiconductor device according to the present embodiment is constituted.

As described above, the semiconductor device according to the present embodiment is characterized mainly in that the channel layer 18 of SiGe is formed only just below the gate electrode 22 and the sidewall insulation film 28.

In the semiconductor device according to the first embodiment, the channel layer 18 of SiGe and the metal film 38 are reacted with each other to form the source/drain electrodes 34b of the metal silicide, and when the material of the metal film is cobalt, the metal silicide cannot be low resistive. The contact resistance of the source/drain electrodes 34b is high. When the source/drain electrodes 34b of a metal silicide on the channel layer 18 of SiGe, cobalt cannot be used as the material of the metal film 38. Accordingly, in the semiconductor device according to the first embodiment, the material of the metal film 38 used in forming the source/drain electrodes 32 is much limited.

In contrast to this, in the present embodiment, wherein that of the channel layer 18, which is not covered with the gate electrode 22 and the sidewall insulation film 28 is etched off, when the source/drain electrodes 34b of a metal silicide are formed, the Si atoms in the silicon substrate 10 and metal atoms in the metal film 38 react with each other. According to the present embodiment, even when SiGe is used as the material of the channel layer 18, and cobalt is used as the material of the metal film 38, the metal silicide can be low resistive. Thus, the present embodiment allows the material of the metal film 38 used in forming the source/drain electrodes 32 to be selected out of a wide variety of materials.

(The Method for Fabricating the Semiconductor Device)

Next, the method for fabricating the semiconductor device according to the present embodiment will be explained with reference to FIGS. 14A to 15B. FIGS. 14A to 15B are sectional views of the semiconductor device according to the present embodiment in the steps of the method for fabricating the semiconductor device, which show the method.

The steps up to the step of forming the silicon oxide film 28 including the silicon oxide film 28 forming step are the same as those of the method for fabricating the semiconductor device described above with reference to FIGS. 8A to 10C, and their explanation will be omitted.

Next, the silicon oxide film 28 is anisotropically etched to form the sidewall insulation film 28 of the silicon oxide film on the side wall of the gate electrode 22. At this time, the channel layer 18 in the region other than the region just below the gate electrode 22 and the sidewall insulation film 28 is also etched off by overetching (see FIG. 14A).

Figure 14A:
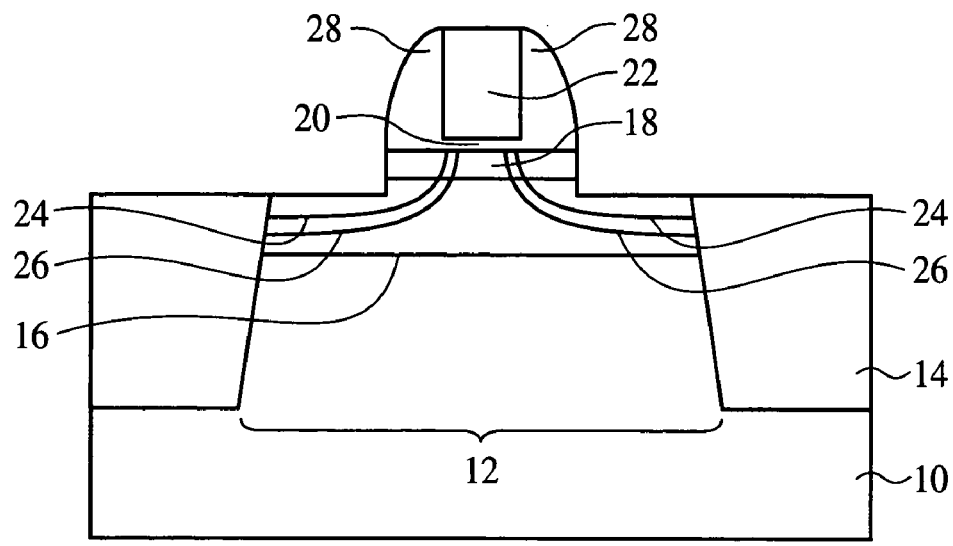
FIGS. 14A and 14B are sectional views of the semiconductor device according to the second embodiment of the present invention in the steps of the method for fabricating the semiconductor device, which show the method (Part 1).
Figure 14B:
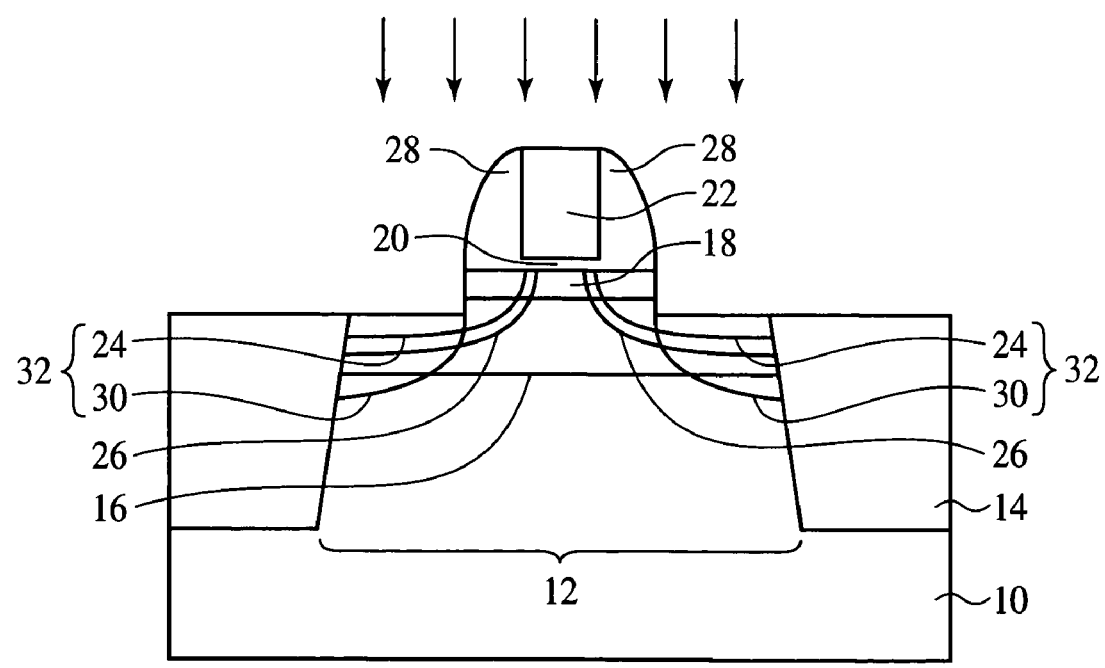

Then, as shown in FIG. 14B, with the gate electrode 22 and the sidewall insulation film 28 as them ask, the p-type dopant impurity is implanted by, e.g., ion implantation. Thus, the source/drain diffused layer forming the deep regions of the extension source/drain structure is formed.

Figure 15A:
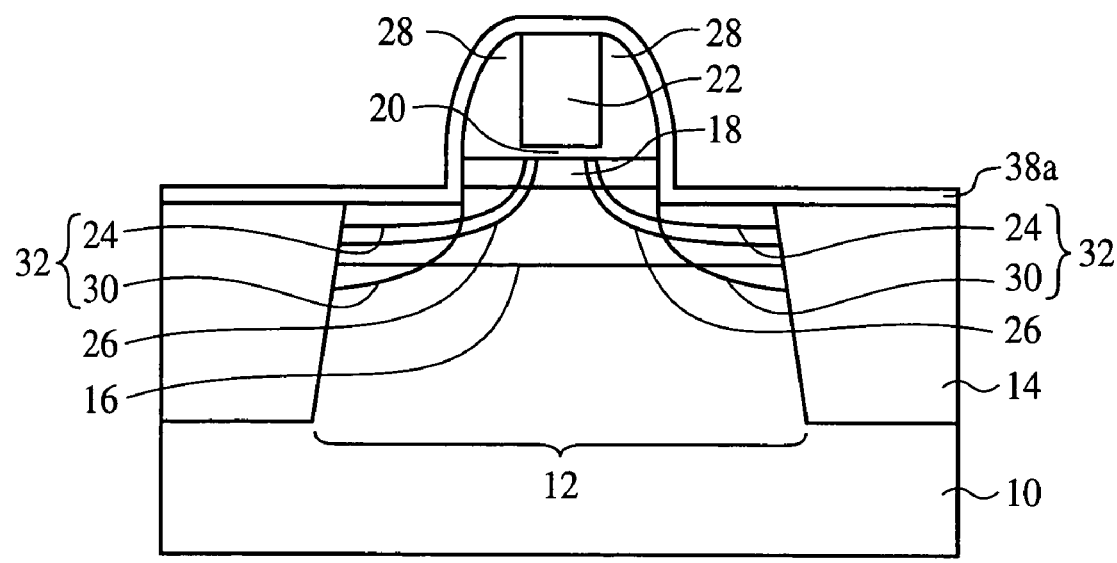
FIGS. 15A and 15B are sectional views of the semiconductor device according to the second embodiment of the present invention in the steps of the method for fabricating the semiconductor device, which show the method (Part 2).

Next, as shown in FIG. 15A, the metal film 38a of cobalt (Co) is formed on the entire surface by, e.g., sputtering. The thickness of the metal film 38a is, e.g., about 10 nm.

Then, the Co in the metal film 38a and the Si in the silicon substrate 10 are reacted with each other by thermal processing. The Co in the metal film 38a and the Si in the gate electrode 22 are reacted with each other. A condition for the thermal processing is, e.g., about 800° C.

Figure 15B:
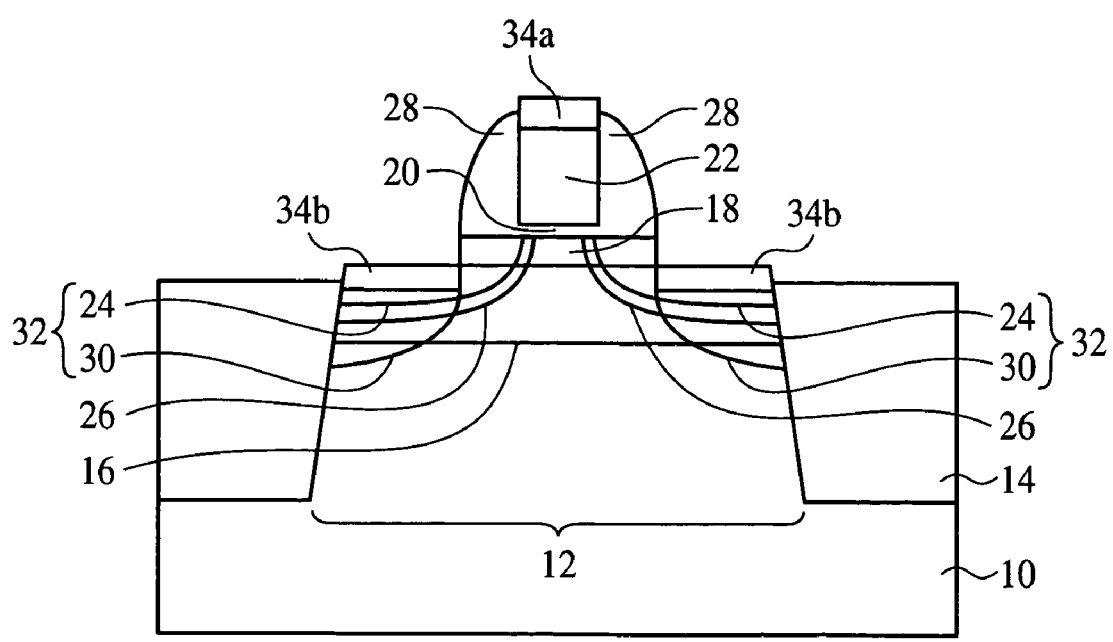

Next, as shown in FIG. 15B, the metal film 38a which has not reacted is etched off. Thus, the source/drain electrodes 34b of the cobalt silicide ($CoSi_2$) is formed on the source/drain diffused layer 32. The gate electrode of the polycide structure of the cobalt silicide film 34a formed on the polysilicon film 22 is also formed.

Thus, the semiconductor device according to the present embodiment is fabricated.

According to the present embodiment, by overetching in anistoripically etching the silicon oxide film to form the sidewall insulation film 28, that of the channel layer 18, which is exposed beyond the gate electrode 22 and the sidewall insulation film 28 is removed, whereby the semiconductor device having the channel layer 18 of SiGe formed only just below the gate electrode 22 and the sidewall insulation film 28 can be fabricated without adding any step.

A Third Embodiment

Figure 16:
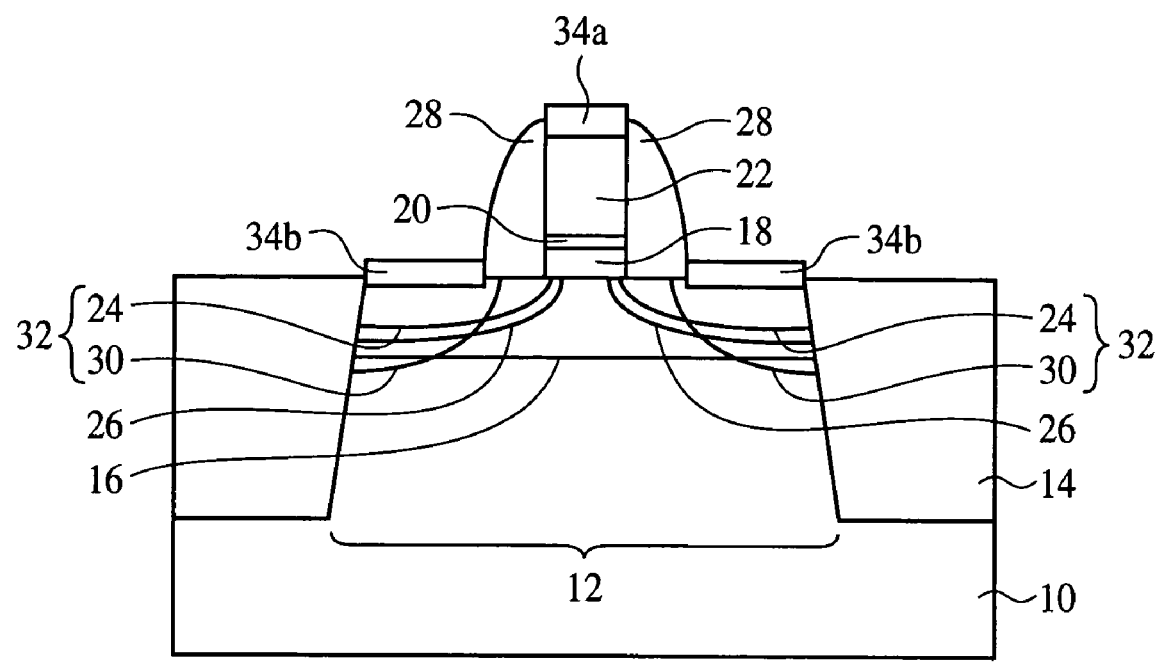
FIG. 16 is a sectional view of the semiconductor device according to a third embodiment of the present invention.

The semiconductor device according to a third embodiment of the present invention will be explained with reference to FIGS. 16 to 20. FIG. 16 is a sectional view of the semiconductor device according to the present embodiment. The same member of the present embodiment as those of the semiconductor device and the method for fabricating the semiconductor device according to the first or the second embodiment shown in FIGS. 1 to 15B are represented by the same reference numbers not to repeat or to simplify their explanation.

The semiconductor device according to the present embodiment is characterized mainly in that a channel layer 18 is formed only just below the a gate electrode 22.

As shown in FIG. 16, the channel layer 18 is formed only just below the gate electrode 22. The channel layer 18 in the region other than the region just below the gate electrode 22 is etched off.

Source/drain electrodes of cobalt silicide ($CoSi_2$) are formed on a source/drain diffused layer 32.

The source/drain electrodes 34b are formed of cobalt silicide here. However, the material of the source/drain electrodes 34b is not limited to cobalt silicide, and any other metal silicide is suitably used to form the source/drain electrodes 34b.

Thus, the semiconductor device according to the present embodiment is constituted.

The semiconductor device according to the present embodiment is characterized in that, as described above, the channel layer 18 is formed only just below the gate electrode 22.

Generally, in the channel layer 18 of SiGe, the diffusion of p-type dopant impurities, such as boron (B), etc., is depressed, while n-type dopant impurities, such as arsenic (As), etc. are accelerated. Accordingly, when SiGe is used as the material of the channel layer 18, it is not always easy to suitably control the impurity profile near the channel.

In the present embodiment, wherein the channel layer 18 of SiGe is formed only just below the gate electrode 22, the source/drain diffused layer 32 and the pocket regions 26 are not formed in the channel layer 18 of SiGe but only in the silicon substrate 10. According to the present embodiment, the source/drain diffused layer 32 and the pocket regions 26 are not required to be formed in the channel layer 18, in which the impurity profile is difficult to be controlled, which makes easy to control the impurity profile.

(The Method for Fabricating the Semiconductor Device)

Next, the method for fabricating the semiconductor device according to the present embodiment will be explained with reference to FIGS. 17A to 20B. FIGS. 17A to 20B are sectional views of the semiconductor device according to the present embodiment in the steps of the method for fabricating the semiconductor device, which show the method.

Figure 17A:
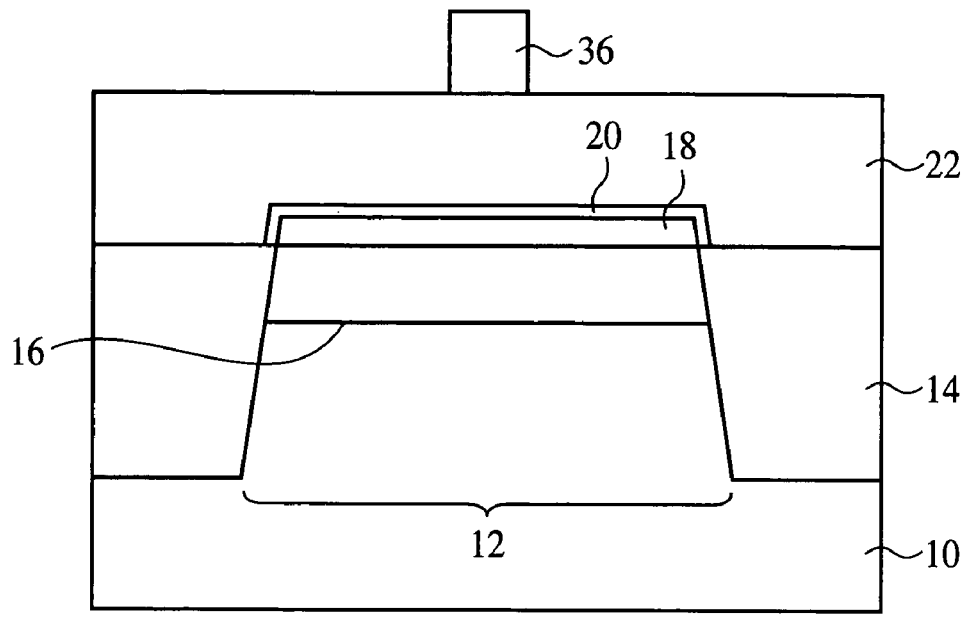
FIGS. 17A and 17B are sectional views of the semiconductor device according to the third embodiment of the present invention in the steps of the method for fabricating the semiconductor device, which show the method (Part 1).

The steps up to the step of patterning a photoresist film 36 including the photoresist film 36 patterning step are the same as those of the method for fabricating the semiconductor device described above with reference to FIGS. 8A to 9B, and their explanation will be omitted (see FIG. 17A).

Figure 17B:
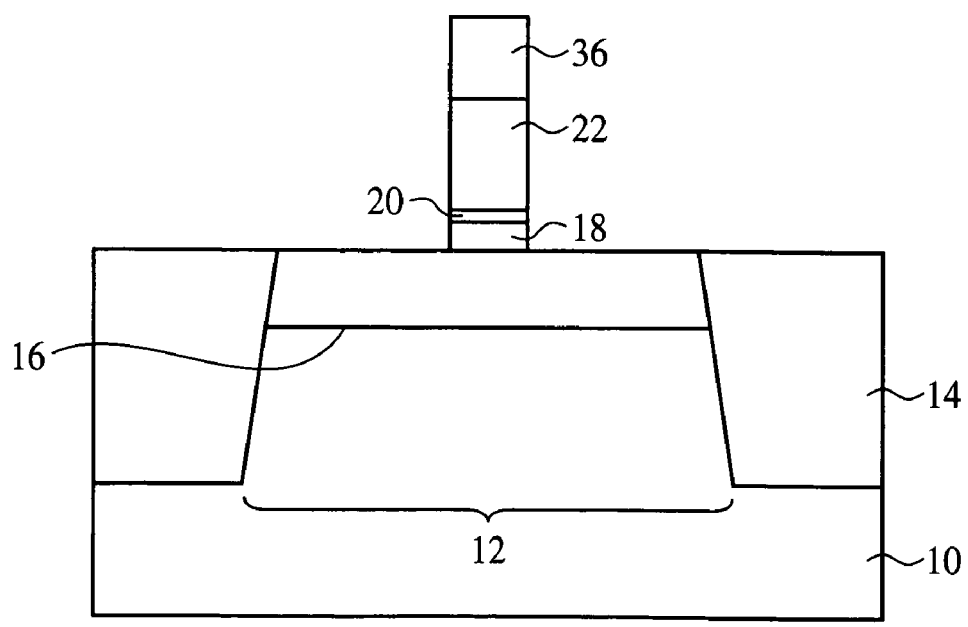
Figure 18A:
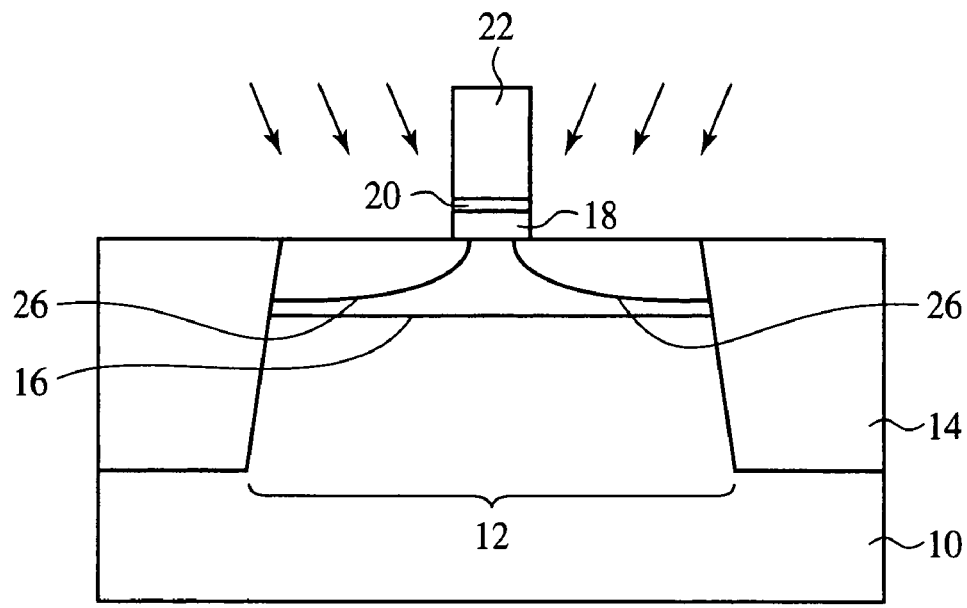
FIGS. 18A and 18B are sectional views of the semiconductor device according to the third embodiment of the present invention in the steps of the method for fabricating the semiconductor device, which show the method (Part 2).
Figure 18B:
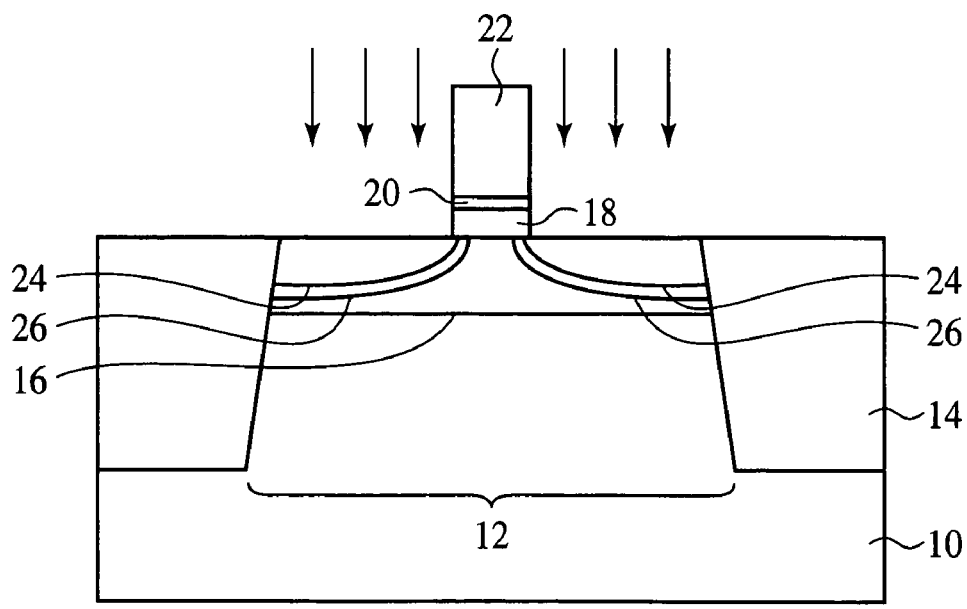
Figure 19A:
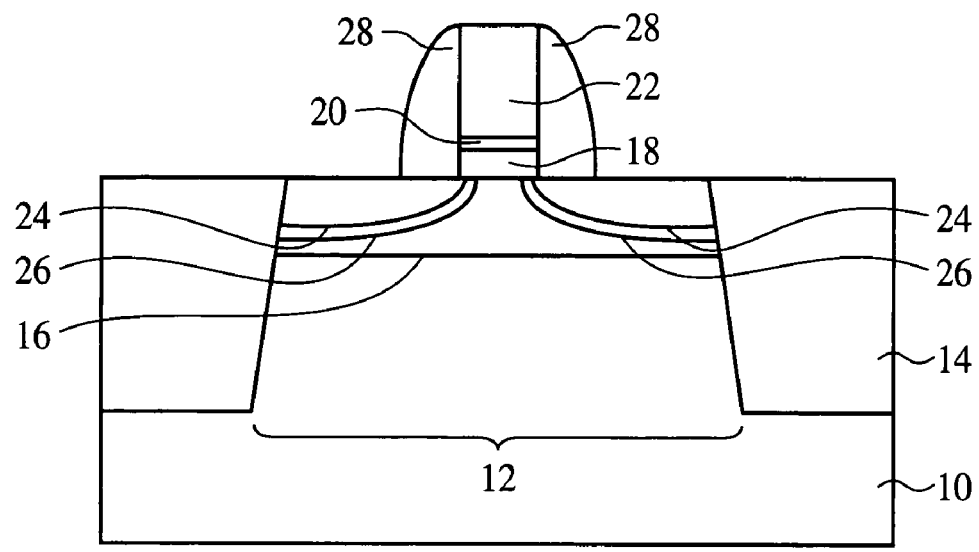
FIGS. 19A and 19B are sectional views of the semiconductor device according to the third embodiment of the present invention in the steps of the method for fabricating the semiconductor device, which show the method (Part 3).
Figure 19B:
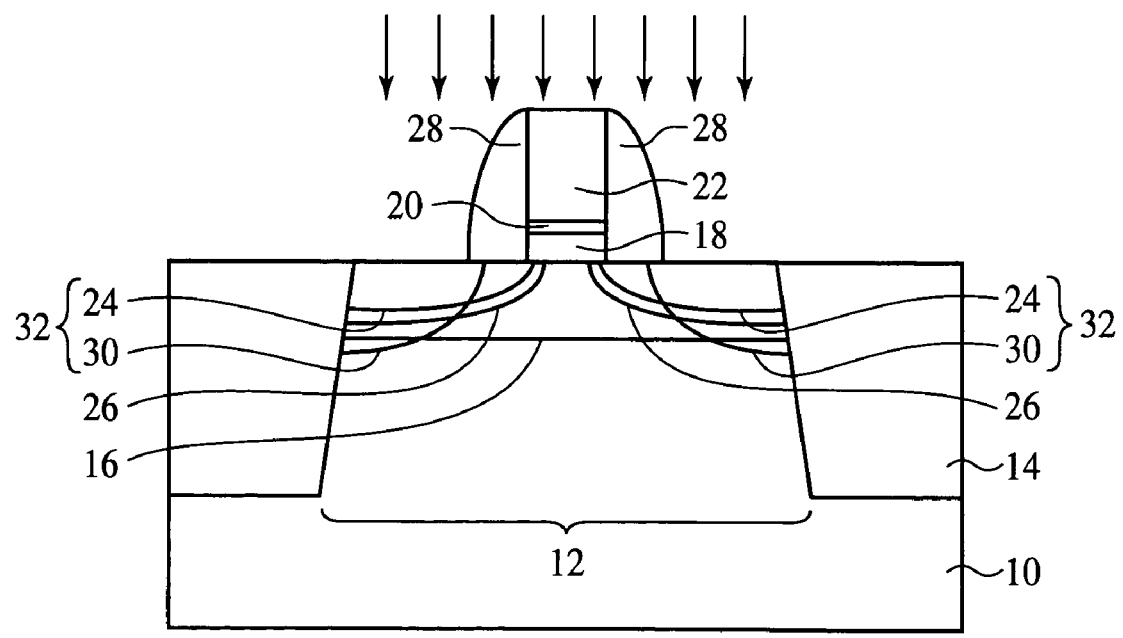
Figure 20A:
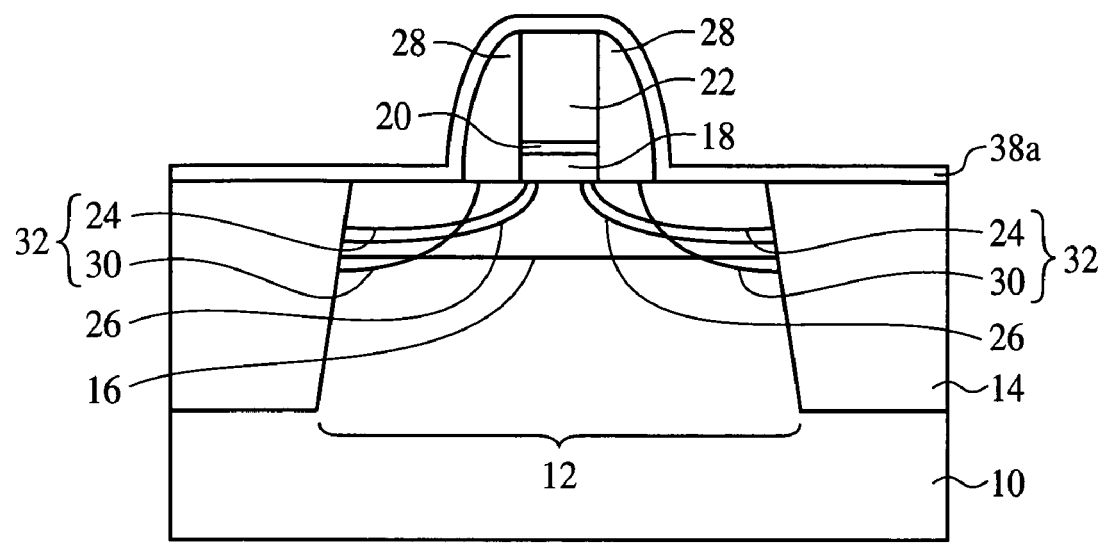
FIGS. 20A and 20B are sectional views of the semiconductor device according to the third embodiment of the present invention in the steps of the method for fabricating the semiconductor device, which show the method (Part 4).
Figure 20B:
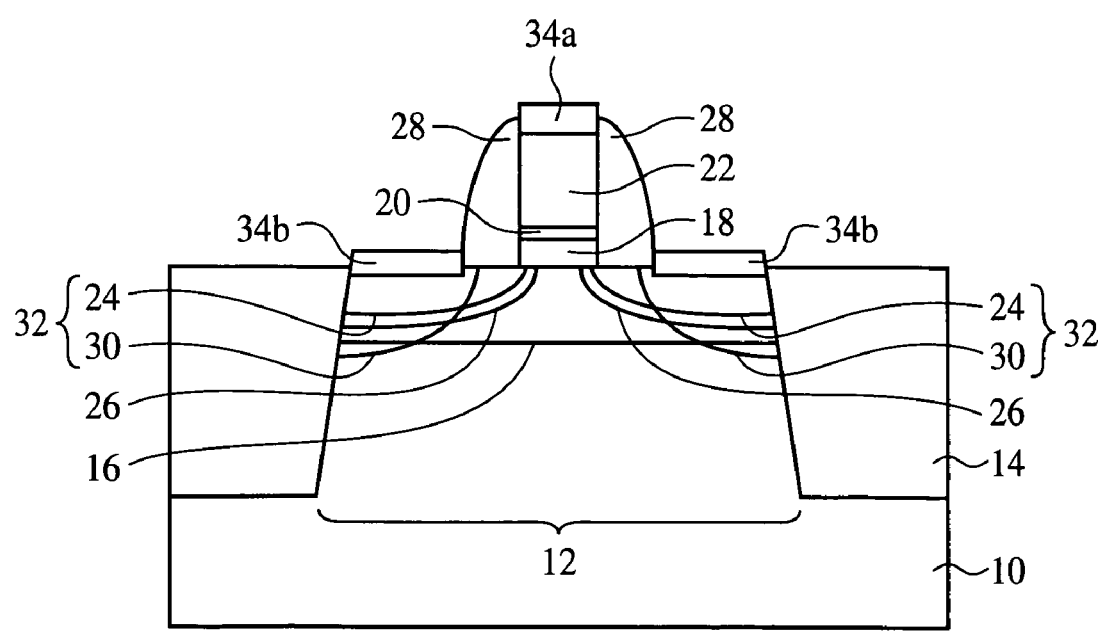

Next, as shown in FIG. 17B, with the photoresist film 36 as the mask, the polysilicon film 22 is dry etched. In this etching, the channel layer 18 in the region where the photoresist film 22 is absent is etched off by overetching. Thus, a gate electrode 22 is formed, and the channel layer 18 in the region other than the region just below the gate electrode 22 is etched off.

The following steps of the method for fabricating the semiconductor device according to the present embodiment are the same as those of the semiconductor evice fabricating method described above with reference to FIGS. 10A to 11B and the semiconductor device fabricating method described above with reference to FIGS. 15A and 15B, and their explanation will be omitted (see FIGS. 18A to 20B).

Thus, the semiconductor device according to the present embodiment is fabricated.

According to the present embodiment, by overetching in patterning the polysilicon film to form the gate electrode 22, the channel layer 18 exposed beyond the gate electrode 22 is removed, whereby the semiconductor device having the channel layer 18 of SiGe formed only just below the gate electrode 22 can be fabricated without adding any step.

A Fourth Embodiment

Figure 21:
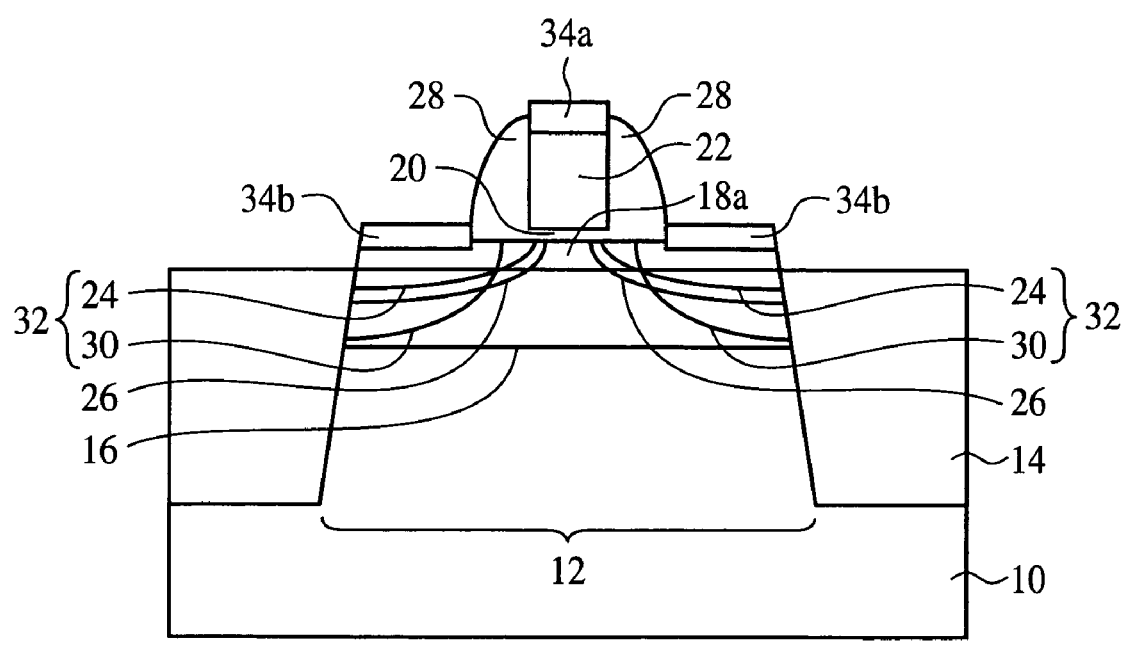
FIG. 21 is a sectional view of the semiconductor device according to a fourth embodiment of the present invention.

The semiconductor device according to a fourth embodiment and the method for fabricating the semiconductor device will be explained with reference to FIGS. 21 to 23. FIG. 21 is a sectional view of the semiconductor device according to the present embodiment. The same members of the present embodiment as those of the semiconductor device according to the first to the third embodiments and the method for fabricating the semiconductor shown in FIGS. 1 to 20B are represented by the same reference numbers not to repeat or to simplify their explanation.

(The Semiconductor Device)

The semiconductor device according to the present embodiment is characterized mainly in that a channel layer 18a of SiGe has an gradient composition of the Ge (germanium), which is decreased gradually from the side nearer to the silicon substrate 10 toward the side nearer to the gate insulation film 20.

As shown in FIG. 21, a channel layer 18a of SiGe is formed on a silicon substrate 10. The thickness of the channel layer 18a is, e.g., about 2–6 nm. The Ge composition of the channel layer 18a is gradually decreased from the side nearer to the silicon substrate 10 toward the gate insulation film 22. The Ge composition of the channel layer 18a at the upper side is, e.g., 0%. The Ge composition of the channel layer 18a at the lower side is, e.g., 30%.

Figure 22A:
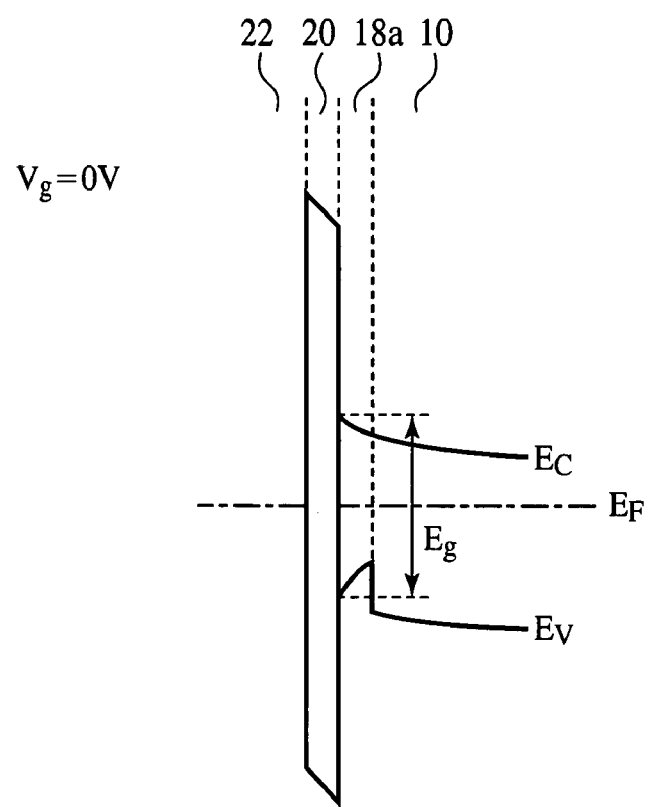
FIGS. 22A and 22B are views of energy band structures of the semiconductor device according to the fourth embodiment of the present invention.
Figure 22B:
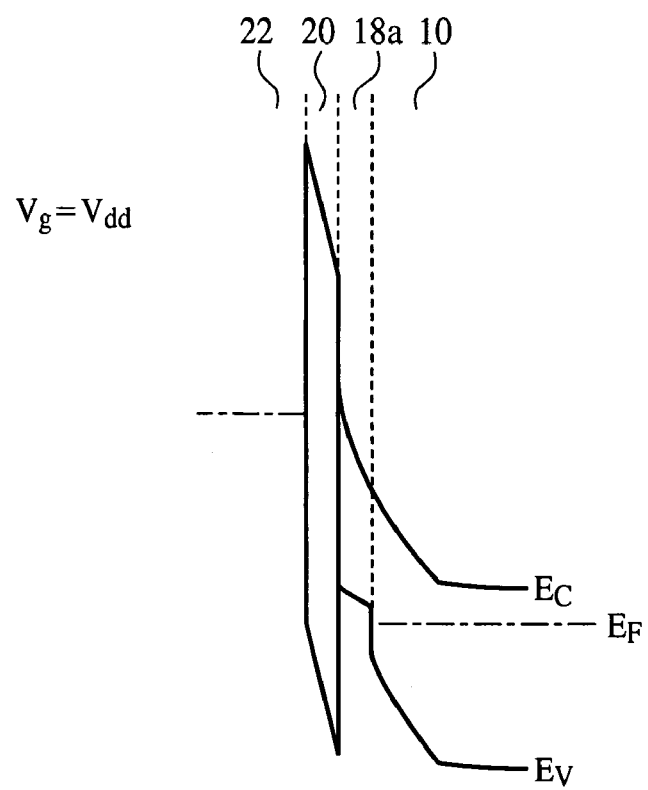

FIGS. 22A and 22B is views of energy band structures of the semiconductor device according to the present embodiment. The Ge composition of the channel layer 18a is decreased from the side nearer to the silicon substrate 10 toward the gate insulation film 20. Furthermore, the channel layer 18a is formed as thin as 2–6 nm so that the quantum confining effect can take place in the channel layer 18a. Accordingly, the present embodiment can make the effective band gap of the channel layer 18a small.

Thus, the present embodiment can increase the carrier mobility, preventing the OFF-state current increase, the ON-state current decrease, etc. without failure.

(The Method for Fabricating the Semiconductor Device)

Figure 23A:
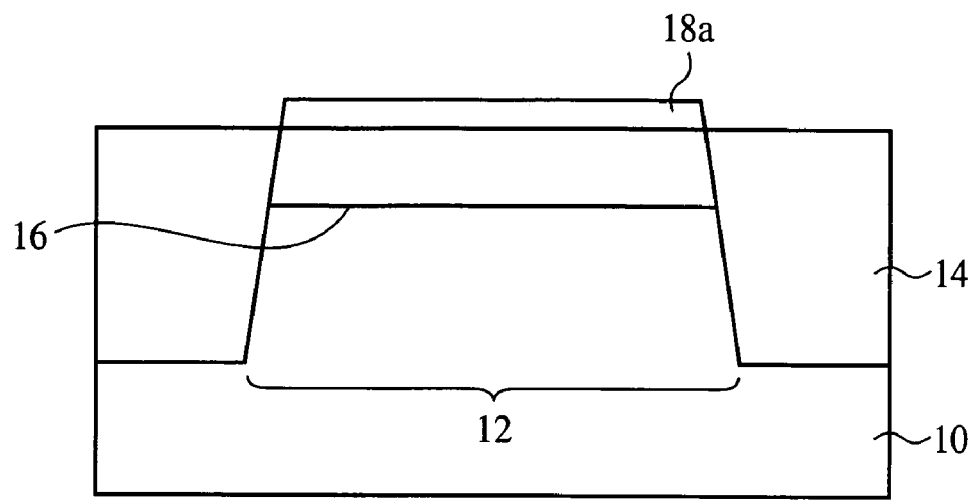
FIGS. 23A and 23B are sectional views of the semiconductor device according to the fourth embodiment of the present invention in the steps of the method for fabricating the semiconductor device, which show the method.
Figure 23B:
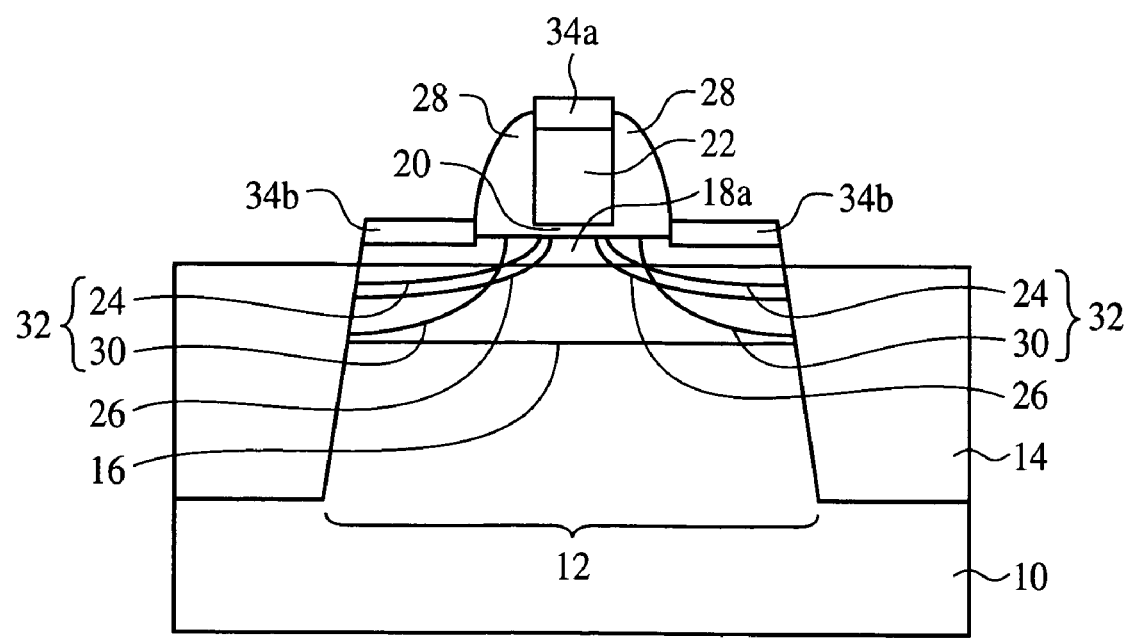

Next, the method for fabricating the semiconductor device according to the present embodiment will be explained with reference to FIGS. 23A and 23B. FIGS. 23A and 23B are sectional views of the semiconductor device according to the present embodiment in the steps of the method for fabricating the semiconductor device, which show the method.

First, the step up to the step of forming a channel doped layer 16 including the channel doped layer 16 forming step are the same as those of the semiconductor device fabricating method described above with reference to FIG. 8A, and their explanation will be omitted.

Then, as shown n FIG. 23A, a channel layer 18a of SiGe is formed by, e.g., CVD. In forming the channel layer 18a, the channel layer 18a is formed so that the Ge composition is gradually decreased. The Ge composition of the channel layer 18a can be gradually decreased by gradually decreasing the flow rate ratio of the material gas as the Ge supply source to the material gas as the Si supply source.

The following steps of the method for fabricating the semiconductor device according to the present embodiment are the the same as those of the semiconductor device fabricating method described above with reference to FIGS. 8C to 12, and their explanation will be omitted.

Thus, the semiconductor device according to the present embodiment is fabricated (see FIG. 23B).

A Fifth Embodiment

Figure 24:
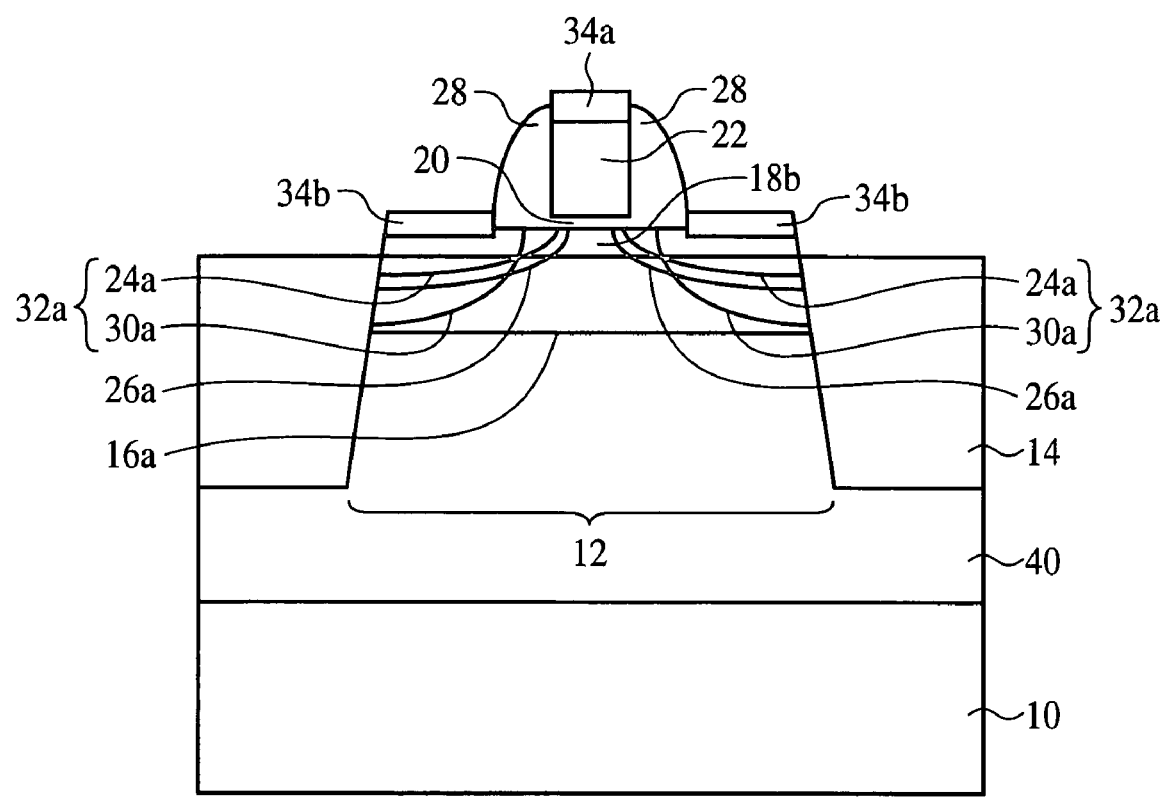
FIG. 24 is a sectional view of the semiconductor device according to a fifth embodiment of the present invention.

The semiconductor device according to a fifth embodiment of the present invention and the method for fabricating the semiconductor device will be explained with reference to FIGS. 24 to 29. FIG. 24 is a sectional view of the semiconductor device according to the present embodiment. The same members of the present embodiment as those of the semiconductor device according to the first to the fourth embodiments and he method for fabricating the semiconductor device shown in FIGS. 1 to 23B are represented by the same reference numbers not to repeat or to simplify their explanation.

(The Semiconductor Device)

The semiconductor device according to the present embodiment is characterized mainly in that a buffer layer 40 of SiGe is formed on a silicon substrate 10, and a channel layer 18b of silicon is formed on the buffer layer 40 of SiGe.

As shown in FIG. 24, the buffer layer 40 of SiGe is formed on the silicon substrate 10. The thickness of the buffer layer 40, e.g., about 2 μm. The thickness of the buffer layer 40 is so thick that lattice strains due to the lattice mismatch between the silicon substrate 10 and the buffer layer 40 are substantially absent in an upper part of the buffer layer 40.

On the buffer layer 40, device isolation regions 14 for defining a device region 12 is formed.

A p-type channel doped layer 16a is formed on the buffer layer 40.

A channel layer 18b of silicon is formed above the buffer layer 40. Because of the lattice constant of silicon, which is smaller than that of SiGe, compression strains takes place in the channel layer 18b of silicon.

N-type impurity diffused regions 24a forming the shallow regions of the extension source/drain structure are formed in the channel layer 18b and the buffer layer 40 on both sides of the gate electrode 22.

In the channel layer 18b and the buffer layer 40, p-type pocket regions 26a are formed adjacent to the n-type impurity diffused regions 24a.

N-type impurity diffused regions 30a forming the deep regions of the extension source/drain structure are formed in the channel region 18b and the buffer layer 40 on both sides of the gate electrode 22 with a sidewall insulation film 28 formed on the side wall. The shallow impurity diffused regions 24a and the deep impurity diffused regions 30a form an n-type source/drain diffused layer 32a.

Figure 25A:
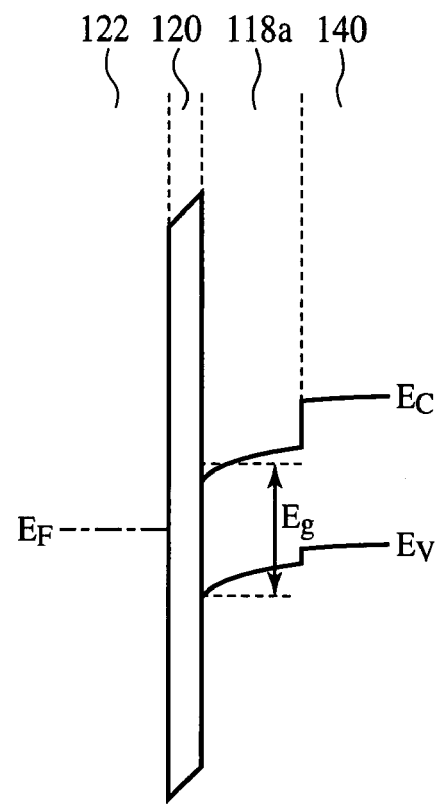
FIGS. 25A and 25B are energy band structures of a buffer layer of SiGe and a channel layer of silicon formed sequentially on a silicon substrate.
Figure 25B:
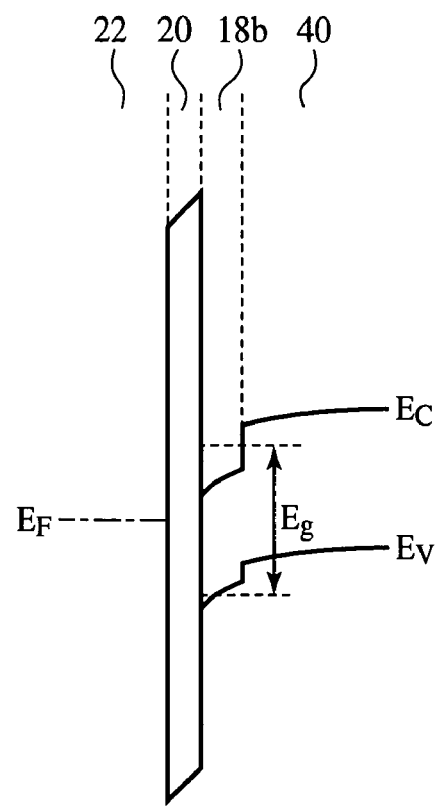

FIGS. 25A and 25B are views of energy band structure of the buffer layer of SiGe and the channel layer of silicon formed sequentially on the silicon substrate. FIG. 25A shows the energy band structure of the case that the channel layer 118a of silicon is formed as thick as, e.g., about 20 nm on the buffer layer 140 of SiGe. FIG. 25B shows the energy band structure of the present embodiment, i.e., the case that the channel layer 18b of Si is formed as thin as 2–6 nm.

In the semiconductor device according to the present embodiment, because of the channel layer 18b of silicon formed as thin as 2–6 nm, the quantum confining effect can take place in the channel layer of silicon. Accordingly, as shown in FIG. 25B, the effective band gap $E_g$ of the channel layer of silicon can be made large.

Thus, the semiconductor device according to the present embodiment is constituted.

As described above, the semiconductor device according to the present embodiment is characterized mainly in that the buffer layer 40 of SiGe is formed on the silicon substrate 10, and the channel layer 18b of silicon is formed on the buffer layer 40 of SiGe as thin as 2–6 nm.

The semiconductor device according to the present embodiment can cause the quantum confining effect in the channel layer 18b because of the channel layer 18b formed as thin as 2–6 nm, and the effective band gap can be made large. Furthermore, the present embodiment can increase the carrier mobility because of crystal strains introduced in the channel layer 18b, as does the semiconductor device according to the embodiments described above. The semiconductor device according to the present embodiment can increase the carrier mobility without the OFF-state current increase, the ON-state current decrease, etc.

(The Method for Fabricating the Semiconductor Device)

Next, method for fabricating the semiconductor device according to the present embodiment will be explained with reference to FIGS. 26A to 29. FIGS. 26A to 29 are sectional views of the semiconductor device according to the present embodiment in the steps of the method for fabricating the semiconductor device, which show the method.

Figure 26A:
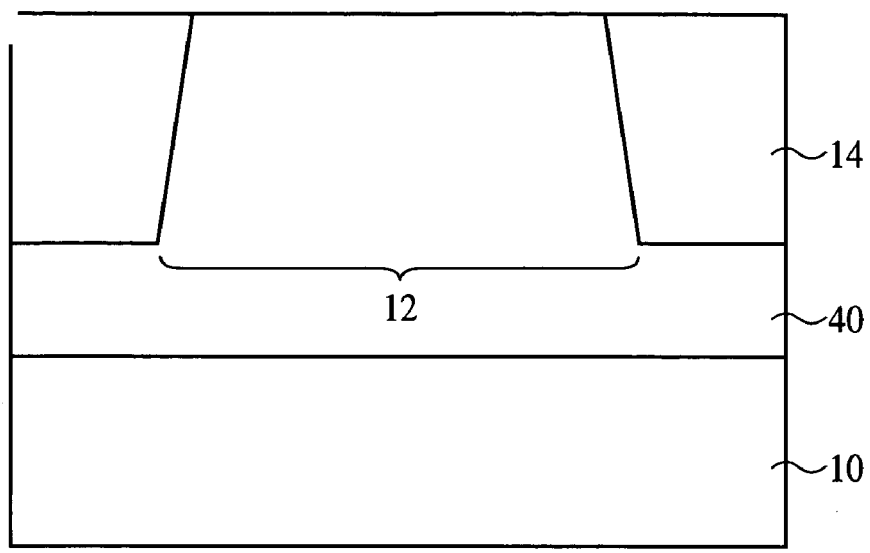
FIGS. 26A and 26B are sectional views of the semiconductor device according to the fifth embodiment of the present invention in the steps of the method for fabricating the semiconductor device, which show the method (Part 1).

As shown in FIG. 26A, a buffer layer 40 of SiGe is formed on a silicon substrate 10. The thickness of the buffer layer 40, e.g., about 2 μm.

Next, device isolation regions 14 for defining a device region 12 is formed on the buffer layer 40 by, e.g., STI.

Figure 26B:
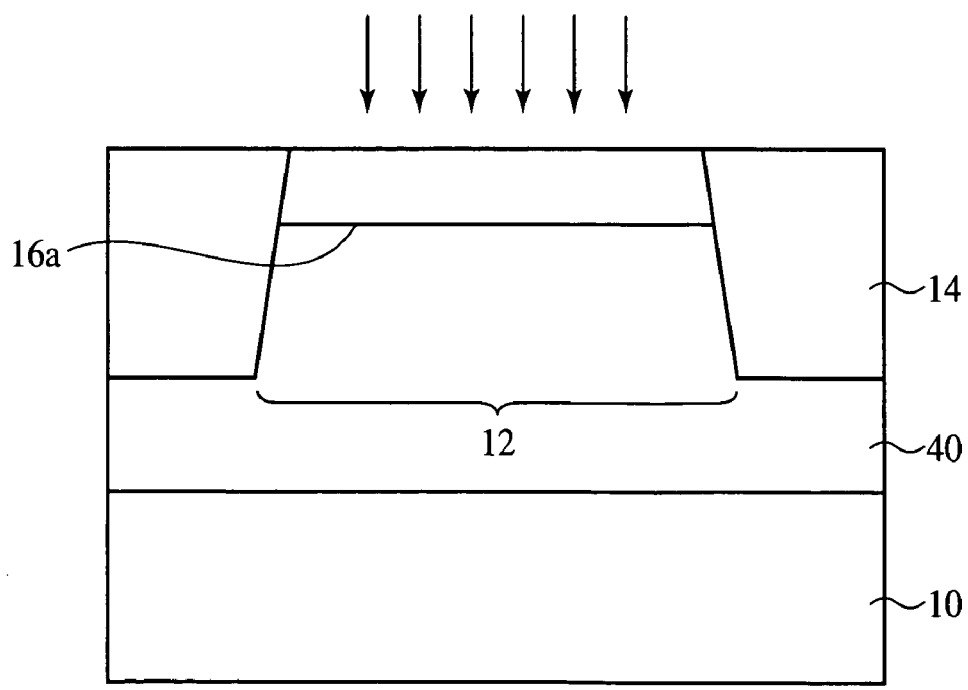

Next, as shown in FIG. 26B, a p-type dopant impurity is implanted in the silicon substrate 10 by, e.g., ion implantation. Thus, p-type channel doped layer 16a is formed in the silicon substrate 10. The channel doped layer 16a is for controlling the threshold voltage $V_{th}$. The p-type dopant impurity is, e.g., boron (B). A condition for the ion implantation is, e.g., a 50 keV acceleration voltage.

Figure 27A:
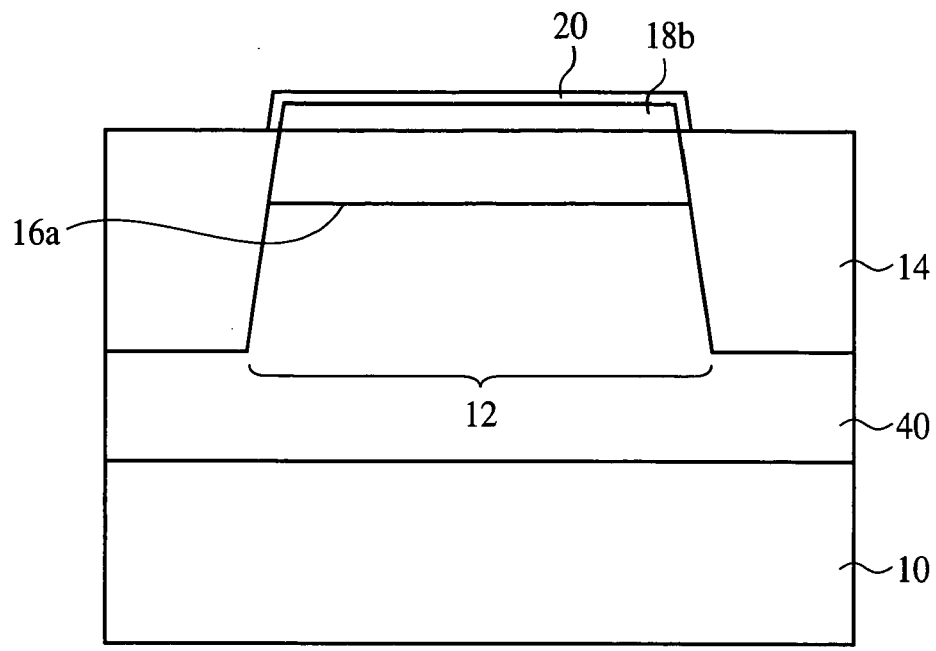
FIGS. 27A and 27B are sectional views of the semiconductor device according to the fifth embodiment of the present invention in the steps of the method for fabricating the semiconductor device, which show the method (Part 2).
Figure 27B:
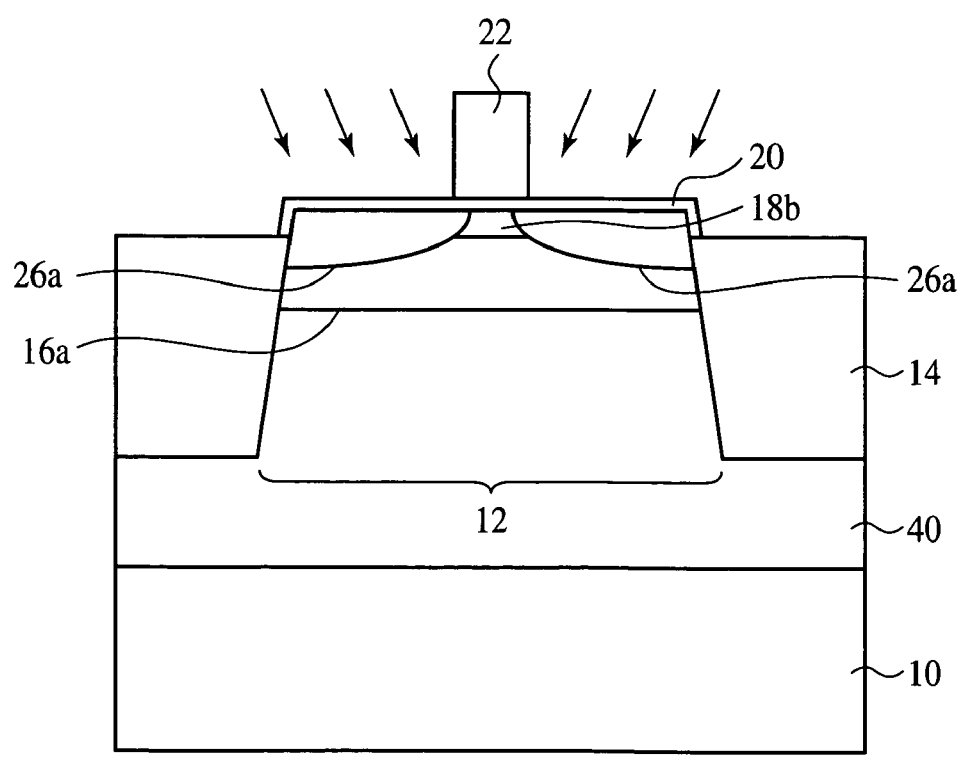

Then, as shown in FIG. 27A, the channel layer 18b of silicon is formed on the device region 12 by, e.g., CVD. The thickness of the channel layer 18b is, e.g., about 8 nm.

Then, the gate insulation film 20 is formed on the channel layer 18b by thermal oxidation. When the gate insulation film 20 is formed, the surface of the channel layer 18b is oxidized to thereby form the gate insulation film 20 of the silicon oxide film. Since the gate insulation film 20 is formed by oxidizing the surface of the channel layer 18b, the thickness of the gate insulation film 20 becomes about 2–6 nm.

The following step of forming the polysilicon film 22 to the step of forming the gate electrode 22 including the gate electrode 22 forming step are the same as those of the semiconductor device fabricating method described above with reference to FIGS. 9A to 9C, and their explanation will be omitted.

Then, a p-type dopant impurity is implanted diagonally to the substrate surface by, e.g., ion implantation. Thus, the p-type pocket regions 26a are formed. At this time, the p-type dopant impurity is implanted also in the channel layer 16b. The p-type dopant impurity is, e.g., boron. A condition for the ion implantation is a 10 keV acceleration voltage.

Figure 28A:
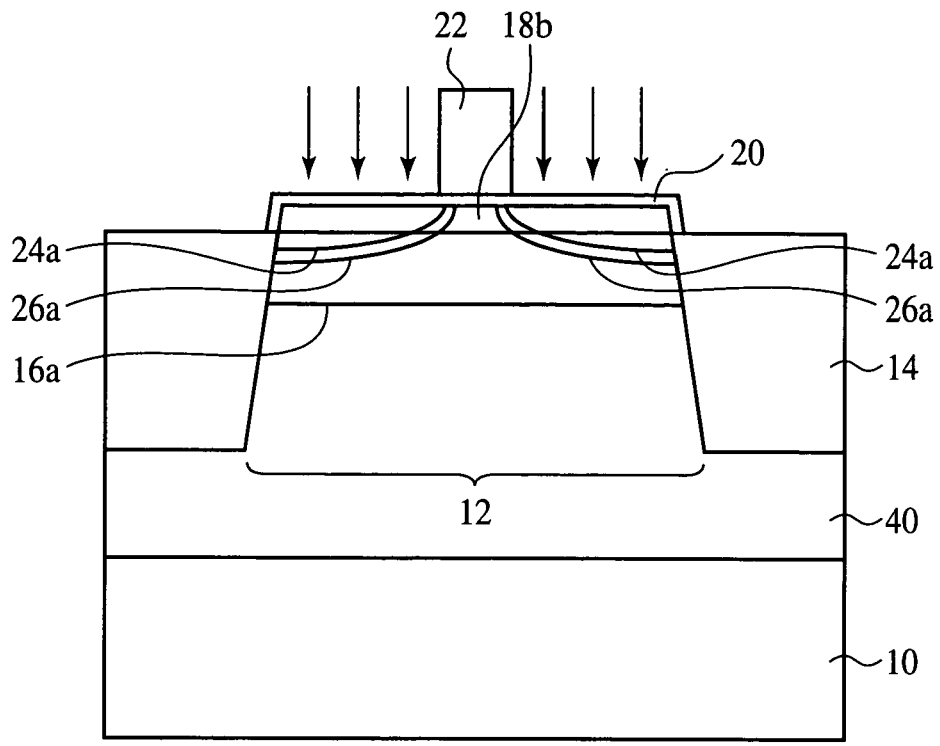
FIGS. 28A and 28B are sectional views of the semiconductor device according to the fifth embodiment of the present invention in the steps of the method for fabricating the semiconductor device, which show the method (Part 3).

Then, as shown in FIG. 28A, with the gate electrode 22 as the mask, an n-type dopant impurity is implanted in the buffer layer 40 by, e.g., ion implantation. The n-type dopant impurity is, e.g., arsenic (As). A condition for the ion implantation is, e.g., a 5 keV acceleration voltage. Thus, the impurity diffused regions 24a forming the shallow regions of the extension source/drain structure are formed.

The following step of forming the silicon oxide film 28 to the step of forming the sidewall insulation film 28 including the sidewall insulation film 28 forming step are the same as those of the semiconductor device fabricating method described above with reference to FIG. 10C to 11A, and their explanation will not be explained.

Figure 28B:
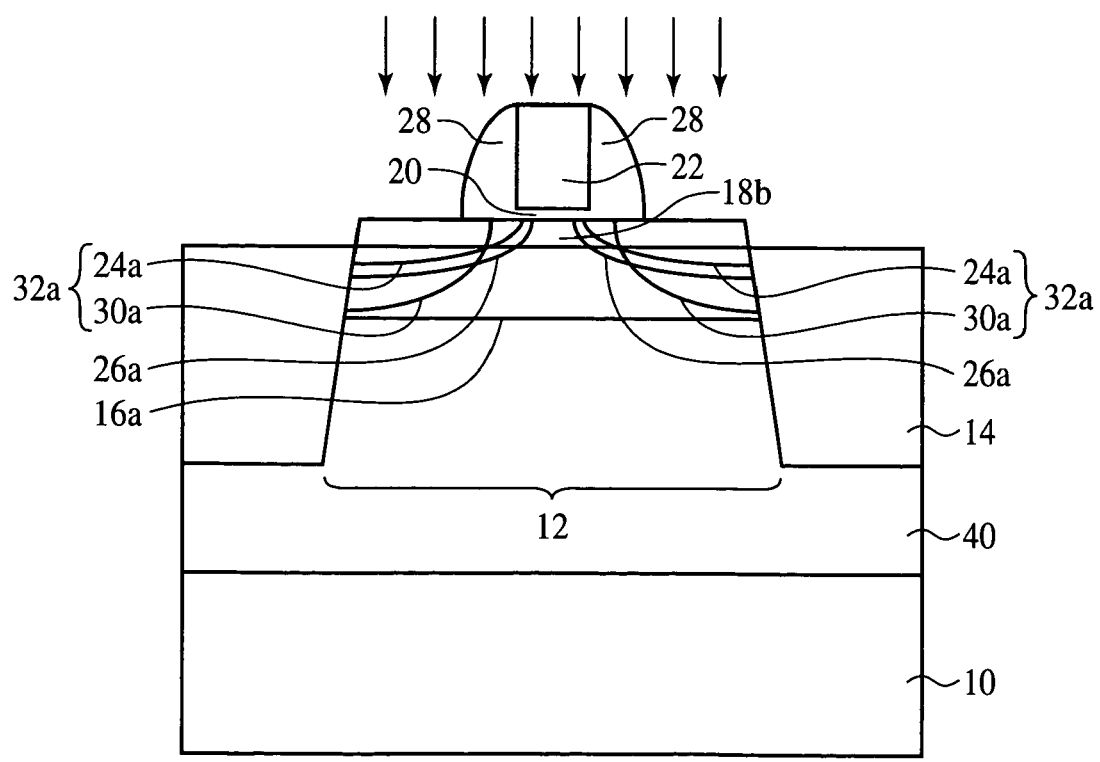

Next, as shown in FIG. 28B, with the gate electrode 22 and the sidewall insulation film 28 as the mask, an n-type dopant impurity is implanted in the channel layer 18b and the buffer layer 40. Thus, the impurity diffused regions 30a forming the deep regions of the extension source/drain structure. The n-type dopant impurity is, e.g., arsenic (As).

As a conditions for the ion implantation is, e.g., a 10 keV acceleration voltage. The extension regions, i.e., the shallow impurity diffused regions 24a and the deep impurity diffused regions 30a form the source/drain diffused layer 32a.

The following steps of the method for fabricating the semiconductor device according to the present embodiment are the same as those of the semiconductor device fabricating method described above with reference to FIGS. 11B and 12, and their explanation will be omitted.

Figure 29:
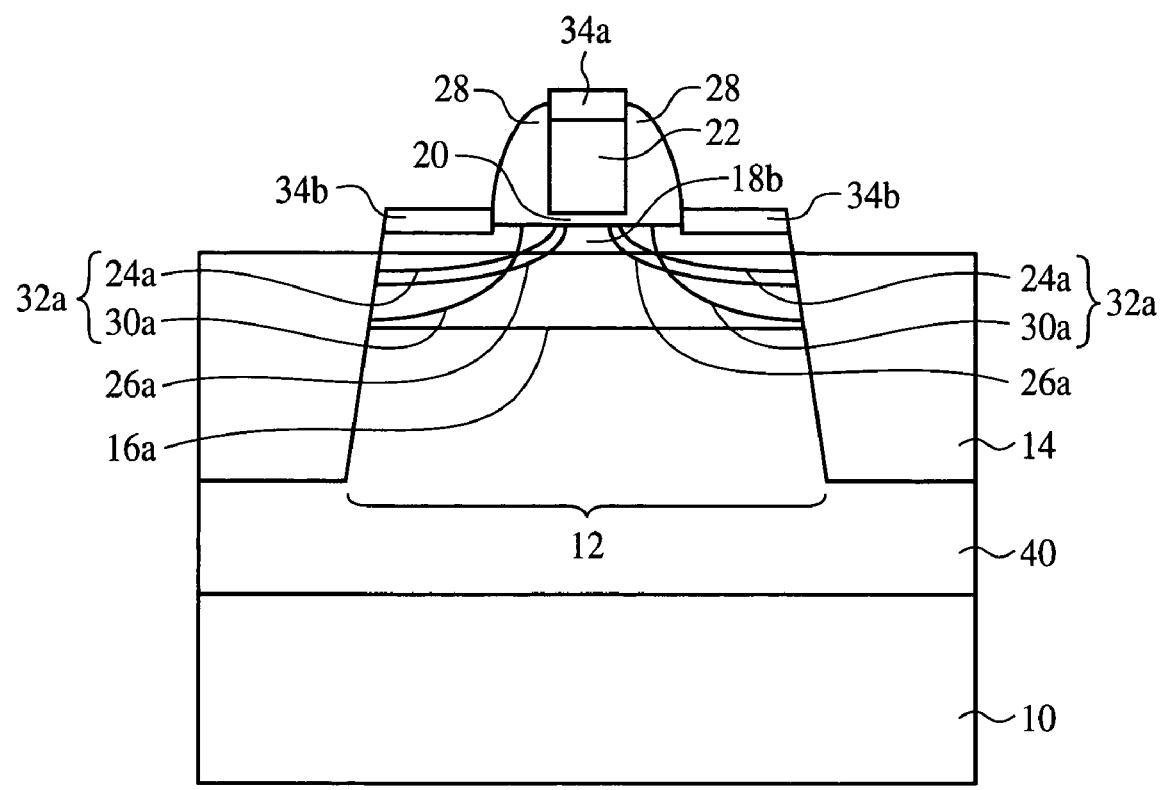
FIG. 29 is a sectional view of the semiconductor device according to the fifth embodiment of the present invention in the steps of the method for fabricating the semiconductor device, which show the method (Part 4).

Thus, the semiconductor device according to the present embodiment is fabricated (see FIG. 29).

Modified Embodiments

The present invention is not limited to the above-described embodiments and can cover other various modifications.

For example, the first to the fourth embodiments have been explained by means of PMOS transistors. However, the principle of the present invention is not limited to PMOS transistors and is applicable any other semiconductor device.

The fifth embodiment has been explained by means of an NMOS transistor. However, the principle of the present invention is not limited to NMOS transistors and is applicable to any other semiconductor device.

What is claimed is:

1. A semiconductor device comprising:
    a channel layer of SiGe formed over a silicon substrate, the channel layer having a thickness of 2 to 6 nm;
    a gate electrode formed over the channel layer with a gate insulation film formed therebetween; and
    a source/drain diffused layer formed on both sides of the gate electrode, wherein
    the channel layer has a gradient composition of germanium which is gradually decreased from a side of the silicon substrate to a side of the insulation film.

2. A semiconductor device according to claim 1, further comprising
    source/drain electrodes of nickel silicide formed on the source/drain diffused layer.

3. A semiconductor device comprising:
    a channel layer of SiGe formed over a silicon substrate, the channel layer having a thickness of 2 to 6 nm;
    a gate electrode formed over the channel layer with a gate insulation film formed therebetween;
    a source/drain diffused layer formed on both sides of the gate electrode; and
    a sidewall insulation film formed on the side wall of the gate electrode, wherein the channel layer is formed only just below the gate electrode and the sidewall insulation film.

4. A semiconductor device according to claim 3, further comprising source/drain electrodes of nickel silicide formed on the source/drain diffused layer.

5. A semiconductor device according to claim 3, further comprising source/drain electrodes of cobalt silicide formed on the source/drain diffused layer.

6. A semiconductor device comprising:
    a channel layer of SiGe formed over a silicon substrate, the channel layer having a thickness of 2 to 6 nm;
    a gate electrode formed over the channel layer with a gate insulation film formed therebetween; and
    a source/drain diffused layer formed on both sides of the gate electrode, wherein
    the channel layer is formed only just below the gate electrode.

7. A semiconductor device according to claim 6, further comprising source/drain electrodes of nickel suicide formed on the source/drain diffused layer.

8. A semiconductor device according to claim 6, further comprising source/drain electrodes of cobalt silicide formed on the source/drain diffused layer.

9. A semiconductor device comprising:
    a buffer layer of SiGe formed over a silicon substrate;
    a channel layer of silicon formed over the buffer layer, the channel layer having a thickness of 2 to 6 nm;
    a gate electrode formed over the channel layer with a gate insulation film formed therebetween; and
    a source/drain diffused layer formed on both sides of the gate electrode.

10. A semiconductor device according to claim 9, further comprising source/drain electrodes of nickel silicide formed on the source/drain diffused layer.

11. A semiconductor device according to claim 9, further comprising source/drain electrodes of cobalt silicide formed on the source/drain diffused layer.

12. A method for fabricating a semiconductor device comprising the steps of:
    forming a channel layer of SiGe formed over a silicon substrate, the channel layer having a thickness of 2 to 6 nm;
    forming a gate electrode over the channel layer with a gate insulation film formed therebetween;
    implanting a dopant impurity into the silicon substrate with the gate electrode as a mask to form first impurity diffused regions on both sides of the gate electrode;
    forming a sidewall insulation film on the side wall of the gate electrode; and
    implanting a dopant impurity into the silicon substrate with the gate electrode and the sidewall insulation film as a mask to form second impurity diffused regions, wherein
    the step of forming a sidewall insulation film includes the step of forming an insulation film over the silicon substrate, covering the gate electrode, and the step of anisotropically etching the insulation film to form the sidewall insulation film of the insulation film on the side wall of the gate electrode, and
    in the step of anisotropically etching the insulation film, the channel layer also in a region other than the region just below the gate electrode and the sidewall insulation film is etched off.

13. A method for fabricating a semiconductor device according to claim 12, wherein
    the metal suicide is cobalt silicide.

14. A method for fabricating a semiconductor device comprising the steps of:
    forming a channel layer of SiGe formed over a silicon substrate, the channel layer having a thickness of 2 to 6 nm;
    forming a gate electrode over the channel layer with a gate insulation film formed therebetween;
    implanting a dopant impurity into the silicon substrate with the gate electrode as a mask to form first impurity diffused regions on both sides of the gate electrode;
    forming a sidewall insulation film on the side wall of the gate electrode; and
    implanting a dopant impurity into the silicon substrate with the gate electrode and the sidewall insulation film as a mask to form second impurity diffused regions, wherein
    the step of forming the gate electrode includes the step of forming a semiconductor film over the gate insulation film, the step of forming a mask over the semiconductor film, and the step of etching the semiconductor film using the mask to form the gate electrode of the semiconductor film, and in the step of etching the semiconductor film, the channel layer also in a region other than the region just below the gate electrode is etched off.

15. A method for fabricating a semiconductor device according to claim 14, wherein the metal suicide is cobalt silicide.

16. A method for fabricating a semiconductor device comprising the steps of:

forming a buffer layer of SiGe over a silicon substrate;

forming a channel layer over the buffer layer, the channel layer having a thickness of 2 to 6 nm;

forming a gate electrode over the channel layer with a gate insulation film formed therebetween:

implanting a dopant impurity into the channel layer and the buffer layer with the gate electrode as a mask to form first impurity diffused regions on both sides of the gate electrode;

forming a sidewall insulation film on the side wall of the gate electrode; and implanting a dopant impurity into the channel layer and the buffer layer with the gate electrode and the sidewall insulation film as a mask to from second impurity diffused regions.

* * * * *